United States Patent [19]
Swanson et al.

[11] Patent Number: 5,889,567
[45] Date of Patent: Mar. 30, 1999

[54] ILLUMINATION SYSTEM FOR COLOR DISPLAYS

[75] Inventors: Gary J. Swanson, Lexington; Ronald P. Gale, Sharon, both of Mass.

[73] Assignees: Massachusetts Institute of Technology, Cambridge; Kopin Corporation, Taunton, both of Mass.

[21] Appl. No.: 565,058

[22] Filed: Nov. 30, 1995

Related U.S. Application Data

[63] Continuation-in-part of Ser. No. 545,990, Oct. 20, 1995, abandoned, which is a continuation-in-part of Ser. No. 443,180, May 17, 1995, which is a continuation-in-part of Ser. No. 330,339, Oct. 27, 1994.

[51] Int. Cl.$^6$ ...................... G02F 1/1335; G02F 1/1333; G02F 1/13
[52] U.S. Cl. .................................. 349/62; 349/8; 349/84; 349/95; 349/201; 359/224; 359/291; 359/771
[58] Field of Search .................................. 349/62, 8, 201, 349/84, 95; 359/224, 291; 348/771

[56] References Cited

U.S. PATENT DOCUMENTS

| | | | |
|---|---|---|---|
| 3,860,955 | 1/1975 | Shinozaki | 358/44 |
| 4,079,411 | 3/1978 | Engelbrecht et al. | 358/6 |
| 4,105,289 | 8/1978 | Hershel | 359/563 |
| 4,255,019 | 3/1981 | Knop | 350/162 |

(List continued on next page.)

FOREIGN PATENT DOCUMENTS

| | | |
|---|---|---|
| 0421855 | 4/1991 | European Pat. Off. . |
| 0583150 | 2/1994 | European Pat. Off. . |
| 0657760 | 6/1995 | European Pat. Off. . |
| 0663770 | 7/1995 | European Pat. Off. . |
| 2742596 | 4/1979 | Germany . |
| 60-165623 | 8/1985 | Japan . |
| 60-165624 | 8/1985 | Japan . |
| 62-94826 | 5/1987 | Japan . |
| 62-150317 | 7/1987 | Japan . |
| 62-293222 | 12/1987 | Japan . |
| 62-293223 | 12/1987 | Japan . |
| 1-281426 | 11/1989 | Japan . |
| 2-296213 | 12/1990 | Japan . |
| 4-367817 | 12/1992 | Japan . |
| 5-249318 | 9/1993 | Japan . |
| 63-118125 | 5/1998 | Japan . |
| 2152724 | 8/1985 | United Kingdom . |
| WO95/22773 | 8/1995 | WIPO . |

OTHER PUBLICATIONS

Swanson, Gary J. et al., "Aperture Filling of Phase–Locked Laser Arrays," Optics Letters, vol. 12 (Apr. 1987), pp. 245–247.

H. Damman, "Color Separation Gratings", Applied Optics, vol. 17, No.15, (Aug. 1978), pp. 2273–2275.

R.F. Edgar, "The Fresnel Diffraction Images of Periodic Structures", Optica Acta, vol. 16, No. 3, (Jun. 1969), pp. 281–287.

M.W.Farn, et al., "Color Separation Gratings", Conf. On Binary Optics, NASA Conf. Pubs. 3227, (Feb. 1993), pp. 409–421.

IBM Techincal Disclosure Bulletin, vol. 36, No. 09B, (Sep. 1993), pp. 453–456, "Improved Liquid Crystal Display Panel Illumination".

M.W. Farn, et al., "Color Separation by Use of Binary Optics", *Optics Letters*, vol. 18, No. 15, (Aug. 1, 1993), pp. 1–3.

*Primary Examiner*—William L. Sikes
*Assistant Examiner*—Julie Ngo
*Attorney, Agent, or Firm*—Hamilton, Brook, Smith & Reynolds, PC

[57] ABSTRACT

Binary optics are used in an illumination system for a color projection display. In one embodiment a broad spectrum light source illuminates a multilevel optical phase element which disperses the broad spectrum light from the light source by diffraction. A display having a number of pixel elements, each capable of transmitting a predetermined spectral region, is positioned within the near field region of the multilevel optical phase element so as to receive the light dispersed by the multilevel phase element.

28 Claims, 25 Drawing Sheets

U.S. PATENT DOCUMENTS

| | | | |
|---|---|---|---|
| 4,277,138 | 7/1981 | Dammann | 350/162 |
| 4,649,351 | 3/1987 | Veldkamp et al. | 330/4.3 |
| 4,686,519 | 8/1987 | Yoshida et al. | 340/701 |
| 4,748,614 | 5/1988 | Dammann et al. | 370/3 |
| 4,798,448 | 1/1989 | Van Raalte | 359/73 |
| 4,807,978 | 2/1989 | Grinberg et al. | 359/20 |
| 4,846,552 | 7/1989 | Veldkamp et al. | 350/162.2 |
| 4,882,619 | 11/1989 | Hasegawa et al. | 348/265 |
| 4,895,790 | 1/1990 | Swanson et al. | 430/321 |
| 4,933,649 | 6/1990 | Swanson et al. | 330/4.3 |
| 4,983,032 | 1/1991 | Van Den Brandt | 353/30 |
| 5,027,359 | 6/1991 | Leger et al. | 372/18 |
| 5,033,060 | 7/1991 | Leger et al. | 372/97 |
| 5,089,023 | 2/1992 | Swanson | 623/6 |
| 5,124,843 | 6/1992 | Leger et al. | 359/565 |
| 5,148,157 | 9/1992 | Florence | 340/783 |
| 5,161,042 | 11/1992 | Hamada | 359/41 |
| 5,161,059 | 11/1992 | Swanson et al. | 359/565 |
| 5,218,471 | 6/1993 | Swanson et al. | 359/565 |
| 5,231,432 | 7/1993 | Glenn | 353/31 |
| 5,233,385 | 8/1993 | Sampsell | 355/35 |
| 5,264,880 | 11/1993 | Sprague et al. | 353/31 |
| 5,272,551 | 12/1993 | Lehureau et al. | 359/19 |
| 5,311,360 | 5/1994 | Bloom et al. | 359/224 |
| 5,344,447 | 9/1994 | Swanson | 623/6 |
| 5,382,961 | 1/1995 | Gale, Jr. | 345/108 |
| 5,442,411 | 8/1995 | Urbanus et al. | 348/771 |
| 5,442,480 | 8/1995 | Swanson et al. | 359/355 |
| 5,448,314 | 9/1995 | Heimbuch et al. | 348/743 |
| 5,457,493 | 10/1995 | Leddy et al. | 348/164 |
| 5,497,269 | 3/1996 | Gal | 359/566 |
| 5,615,024 | 3/1997 | May et al. | 349/57 |

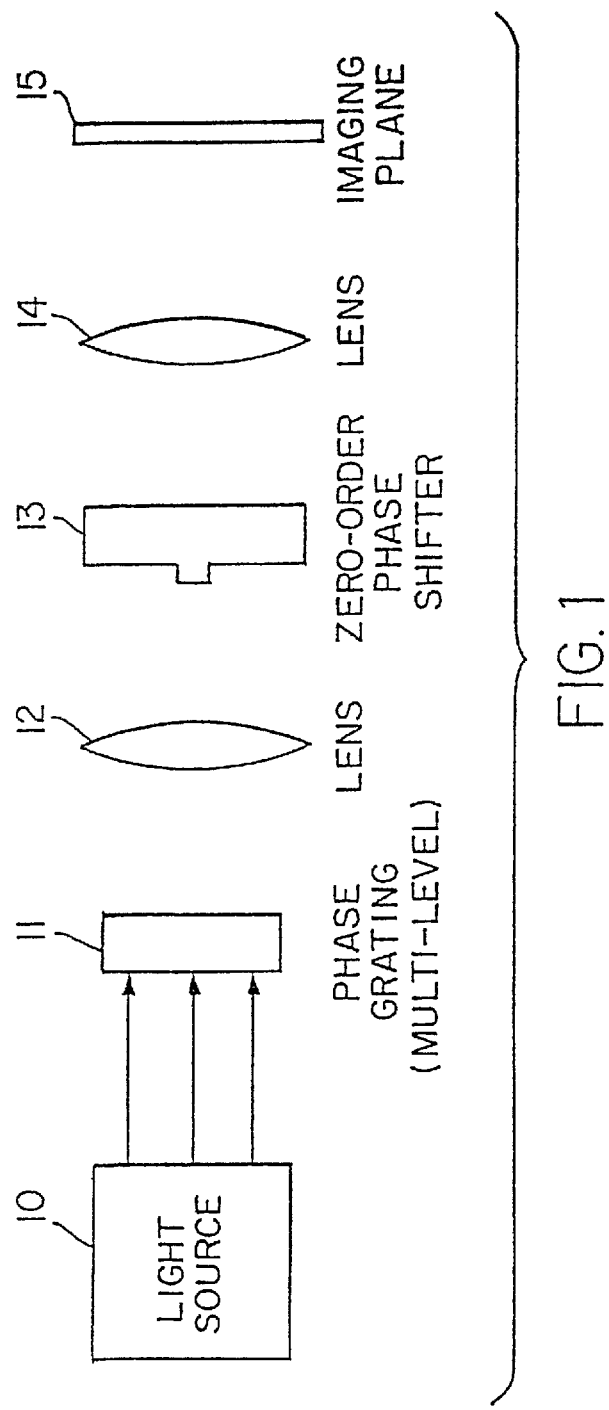

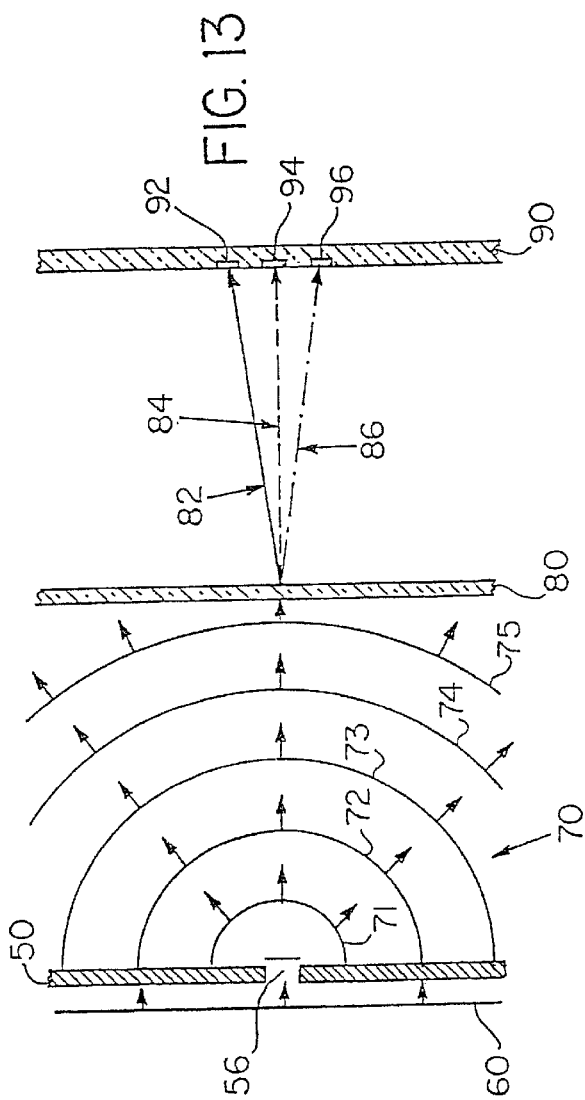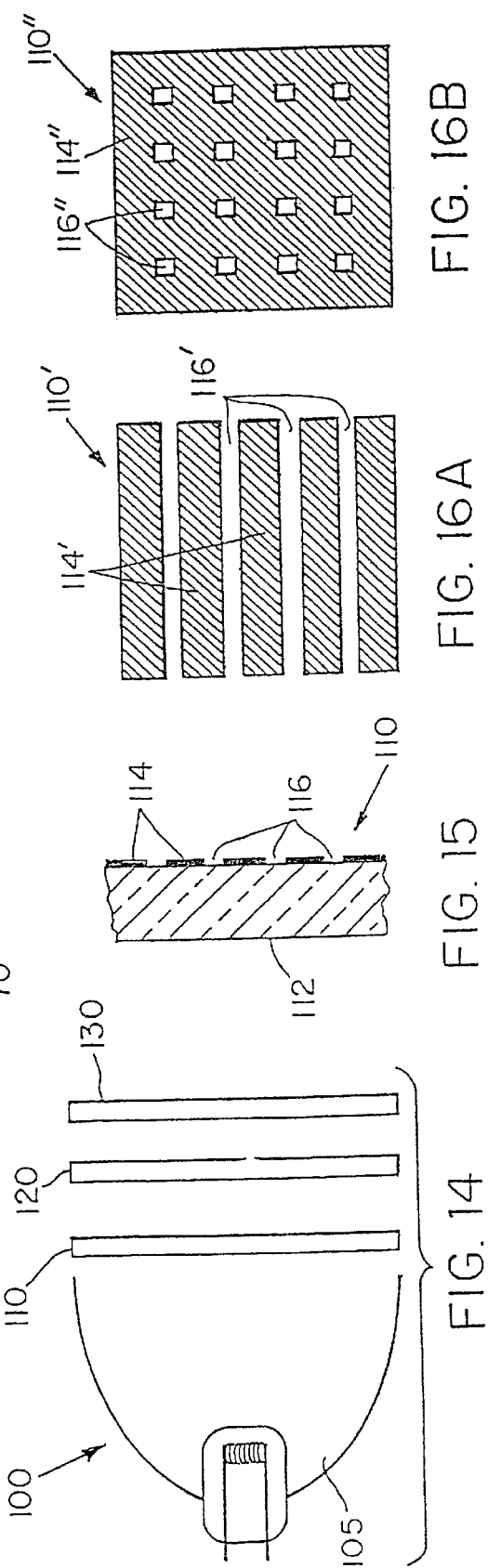

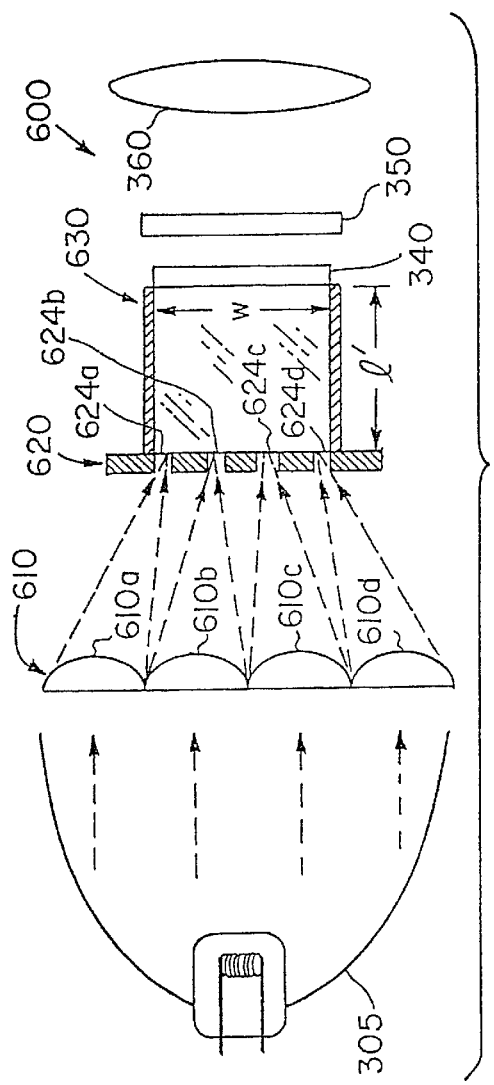
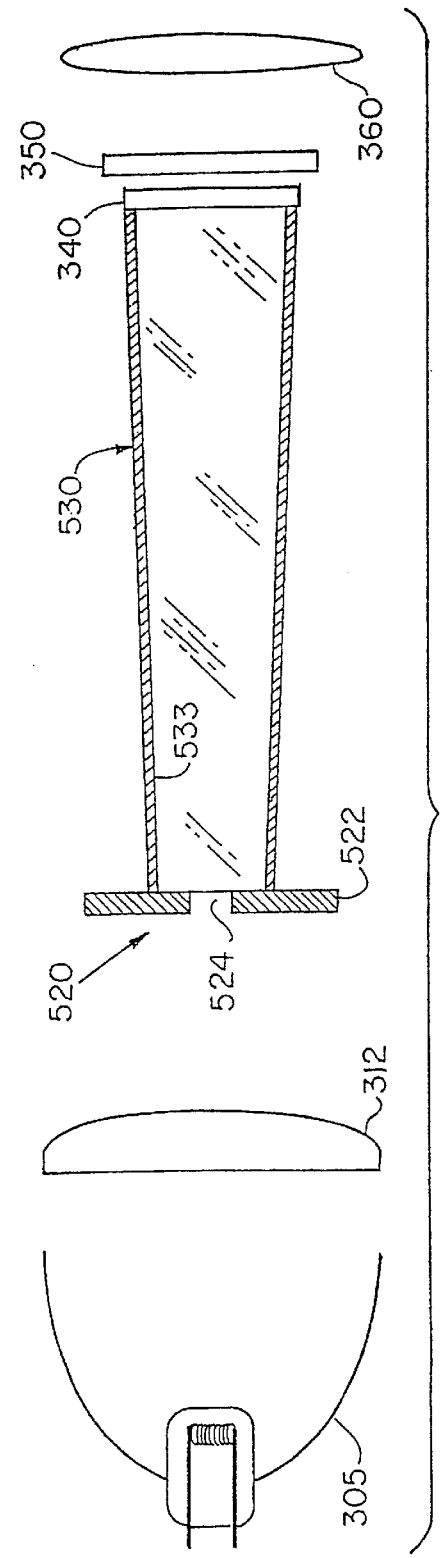

ILLUMINATION SYSTEM FOR COLOR DISPLAYS

RELATED APPLICATIONS

This application is a continuation-in-part application of the U.S. patent application Ser. No. 08/545,980, "Illumination System for Transmissive Light Valve Displays" filed by Gary J. Swanson on Oct. 20, 1995, now abandoned, which is a continuation-in-part of U.S. patent application Ser. No. 08/443,180, filed May 17, 1995, which is a continuation-in-part application of U.S. patent application Ser. No. 08/330,339, filed Oct. 27, 1994, the teachings of which are incorporated herein by reference in their entirety.

GOVERNMENT SUPPORT

This invention was made with government support under contract number F19628-85-C-0002 awarded by the Air Force. The government has certain rights in the invention.

BACKGROUND OF THE INVENTION

Currently used techniques for color projection displays tend to be relatively inefficient in their light utilization. Such low efficiency limits the brightness of the display, which in effect limits the acceptable amount of ambient lighting in a viewing environment.

In certain presently used designs, light from a spectrally broad source is collected by a condensing lens and illuminates a spatial light modulator system. The spatial light modulator system comprises a two-dimensional array of pixels and the amount of light transmitted through each pixel is controlled electronically. A projection lens then images the array of pixels on a viewing screen, the magnification of the displayed image being determined by the particular characteristics of the projection lens. The light impinging on each pixel of the spatial light modulator is spectrally broad (i.e., white light). Therefore, unless the system is modified to distinguish colors, the display is only capable of displaying black and white images.

In many current systems used to modify such a system so that it is capable of displaying color images, each pixel of the spatial light modulator is divided into three sub-pixels having equal areas. Each of the three sub-pixels is covered with a micro-color filter having a different spectral transmittance. For example, the filters are chosen such that one filter transmits only red light, another filter only green light, and the third filter only blue light. The transmittances of the three sub-pixels of each pixel of the spatial light modulator can be controlled independently, resulting in the ability to display a color image.

The inefficiency of the approach can be seen by considering the following factors. The light illuminating a full pixel essentially is white light and, consequently, the light impinging each sub-pixel is also white light. The red filtered sub-pixel transmits only red light, absorbing all of the incident green and blue light. Likewise, the other two sub-pixels transmit only its corresponding color, absorbing the other two colors. It is apparent that this approach utilizes, at most, only one third of the available light impinging on the modulator, and absorbs the rest.

Furthermore, state-of-the-art microcolor filters required to produce acceptable color images are approximately only 33% efficient in transmitting the color that they are designed to transmit. Therefore the overall light utilization of current color projection displays is about 10%.

One approach for improving the efficiency of color projection displays is found in U.S. Pat. No. 5,161,042 issued on Nov. 3, 1994 to H. Hamoda. In accordance therewith, the spectrally broad input light is supplied to three dichroic mirrors which reflect three different color components, e.g., red, green, and blue, in different directions, i.e., at different angles with respect to each other. The reflected components are then supplied to an array of lenses for focusing the different color components so as to converge light beams of similar wavelength ranges for transmission through a liquid crystal display element so as to form combined color images on a display screen. A further U.S. Pat. No. 5,264,880, issued on Nov. 23, 1993, to R. A. Sprague et al., discloses a similar approach to that of Hamoda wherein the dichroic mirrors are replaced by a phase grating for dispersing the color components of light received thereat into a spectrum of different colors at different angles relative to each other.

While such approaches can be used, the losses of energy of each color component are sufficient to reduce the efficiencies of such systems and to show the need for further improvement in such display systems. Such improved display systems should minimize such losses so as to provide for substantially the total use of the received energy across the color spectrum in the imaging display process resulting in an improvement of the efficiency of the system.

SUMMARY OF THE INVENTION

The invention relates to a color projection display in which received light, having a relatively broad spectrum, illuminates a multi-level optical phase grating so as to disperse each of the color components contained therein into a plurality of different diffraction orders. In one embodiment, the diffraction orders of each color component are then focussed onto a zero-order phase shift element which phase shifts only the undiffracted light (i.e., the zero diffraction order) with respect to the diffracted light (i.e., the higher level diffraction orders). The output of the zero-order phase shifter is then imaged onto a display having a plurality of pixels, each pixel having sub-pixel regions assigned to transmit different color components of light. The depths of the phase grating element and the zero-order phase shifter are suitably selected so they are practical for manufacture and so the area of chromaticity space for the color components at the image plane is maximized.

The use of such a combination of multi-level phase grating and a zero-order phase shifter, having suitably determined depths, provides desired color components at each pixel in which essentially little or no energy is lost. These color components are then suitably combined to provide a color image at each of the pixels of the display which is considerably brighter than that available using prior known systems.

In another embodiment, a broad spectrum light source illuminates a multilevel optical phase element which disperses the broad spectrum light from the light source by diffraction. A display having a number of pixel elements, each capable of transmitting a predetermined spectral region, is positioned within the near field region of the multilevel optical phase element so as to receive the light dispersed by the multilevel phase element. In one embodiment, the multilevel phase element is periodic in two dimensions, thereby concentrating the light in two dimensions.

In yet another embodiment, a method for displaying a color image is disclosed. The method for displaying a color image includes illuminating a multilevel optical phase element with a broad spectrum light source. The multilevel phase element disperses light from the light source by diffraction. A display having a plurality of pixel elements, each transmitting a predetermined spectral region, is positioned within the near field region of the multilevel optical phase element to receive the dispersed light from the multilevel optical phase element.

Preferred embodiments of the invention include transmissive active matrix liquid crystal display devices. An active matrix array of transistor circuits and pixel electrodes is bonded to an optically transmissive substrate by a layer of adhesive material. A layer of liquid crystal material is disposed over the active matrix array to form a transmissive display structure such that actuation of the pixel electrodes controls transmission of light through a respective volume of the liquid crystal material. A diffractive optical element is also aligned with the active matrix array to disperse light of different colors through different volumes of the liquid crystal material. The active matrix array and the diffractive optical element are mounted within a display or projector housing to form a direct-view or projected-view display device.

Preferred embodiments of the invention also include an array of light reflective pixel electrodes such as digital micromirror display devices. In a digital micromirror display device, a matrix housing contains a digital micromirror array of light reflective, electromechanical pixels and a diffractive optical element. The diffractive optical element is aligned with the digital micromirror array to disperse light of different colors onto different electromechanical pixels. Instead of electromechanical pixel electrodes, a reflector liquid crystal display device can be used.

BRIEF DESCRIPTION OF THE DRAWINGS

The above and other features of the invention, including various novel details of construction and combination of parts, will now be more particularly described with reference to the accompanying drawings and pointed out in the claims. It will be understood that the particular illumination system for color display panels embodying the invention is shown by way of illustration only and not as a limitation of the invention. The principles and features of this invention may be employed in varied and numerous embodiments without departing from the scope of the invention.

FIGS. 1 and 1A are block diagrams of an embodiment of a display system using the technique of the invention;

FIG. 13 is a graphical representation of a constant amplitude wavefront interfacing with an aperture in a mask element.

FIG. 14 is a schematic diagram of a transmissive display system employing a mask element.

FIG. 15 is a foreshortened cross sectional schematic diagram of the masked plate 110 of FIG. 14.

FIGS. 16A–16B are schematic front views of the masked plate 110 of FIG. 14.

FIG. 21 is a schematic diagram of a preferred embodiment of a display system having a changed aspect ratio.

FIG. 22 is a schematic diagram of a preferred embodiment of a display system having a multiple aperture light pipe in accordance with the invention.

DETAILED DESCRIPTION OF THE PREFERRED EMBODIMENTS OF THE INVENTION

To increase the light utilization of color displays, the novel technique of the invention can be considered, in a conceptual sense, as effectively concentrating all of the light of each color component in a received spectrally broad light onto appropriate sub-pixel regions at a color image plane. For example, all of the incident red light is concentrated in a manner such that it only illuminates the sub-pixel regions corresponding to the red component thereof, all of the incident green light is concentrated in a manner such that it only illuminates the sub-pixel regions corresponding to the green component thereof, and all of the incident blue light is concentrated in a manner such that it only illuminates the sub-pixel regions corresponding to the blue component thereof. By so doing, the use of micro-filters is not necessary, and the theoretical light utilization efficiency of such technique approaches 100% (ignoring light loss through the system optics by reflection and absorption).

The invention achieves such light utilization based on a technique referred to as aperture filling. Aperture filling is described, for example, in the article, "Aperture filling of phase-locked laser arrays" by G. J. Swanson et al., *Optics Letters*, Vol. 12, April 1987. This article describes a method for increasing the energy in the central lobe of a far-field pattern of a phase-locked laser array. In accordance with the invention, the underlying physics of this technique is modified and extended in a unique manner to solve the color display problem of light utilization.

In accordance with the basic physics behind aperture filling, a binary amplitude grating (a grating having a transmittance of 1 or 0) with a fill factor (the ratio of the transmitting area to the total area) of greater than or equal to 0.25, has, aside from a phase shift of the zero order, a Fourier transform identical to that of a binary phase grating having the same fill-factor as the binary amplitude grating. By placing a zero-order phase shift element in the transform plane of a focal imaging system, the light from an aperture with a fill-factor of >0.25 can be uniformly spread out to fill the entire aperture. Further, by invoking reciprocity, light from a uniform aperture can be concentrated to produce an underfilled aperture with a fill-factor of $\geq 0.25$.

Figure 1A:
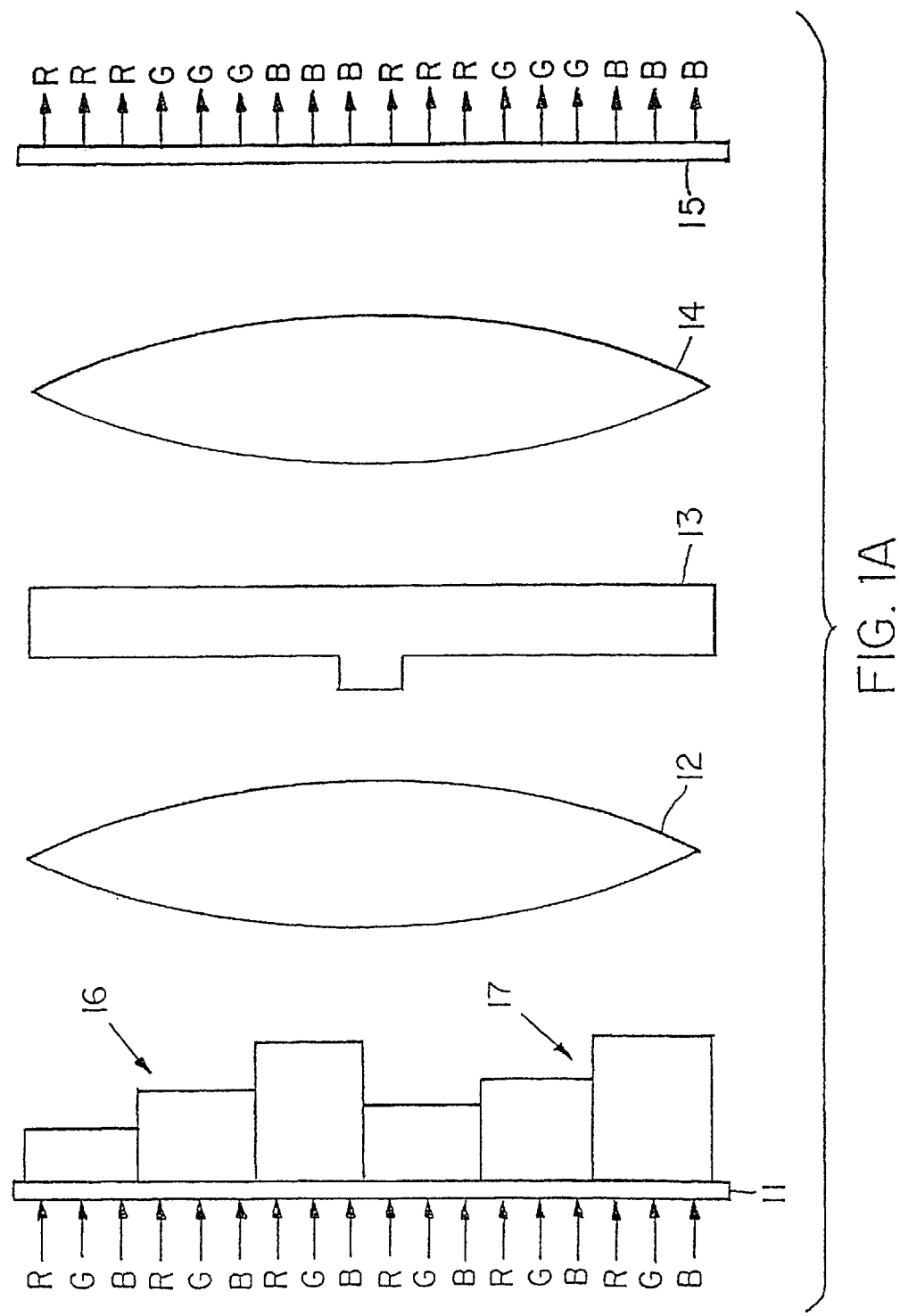
Figure 2:
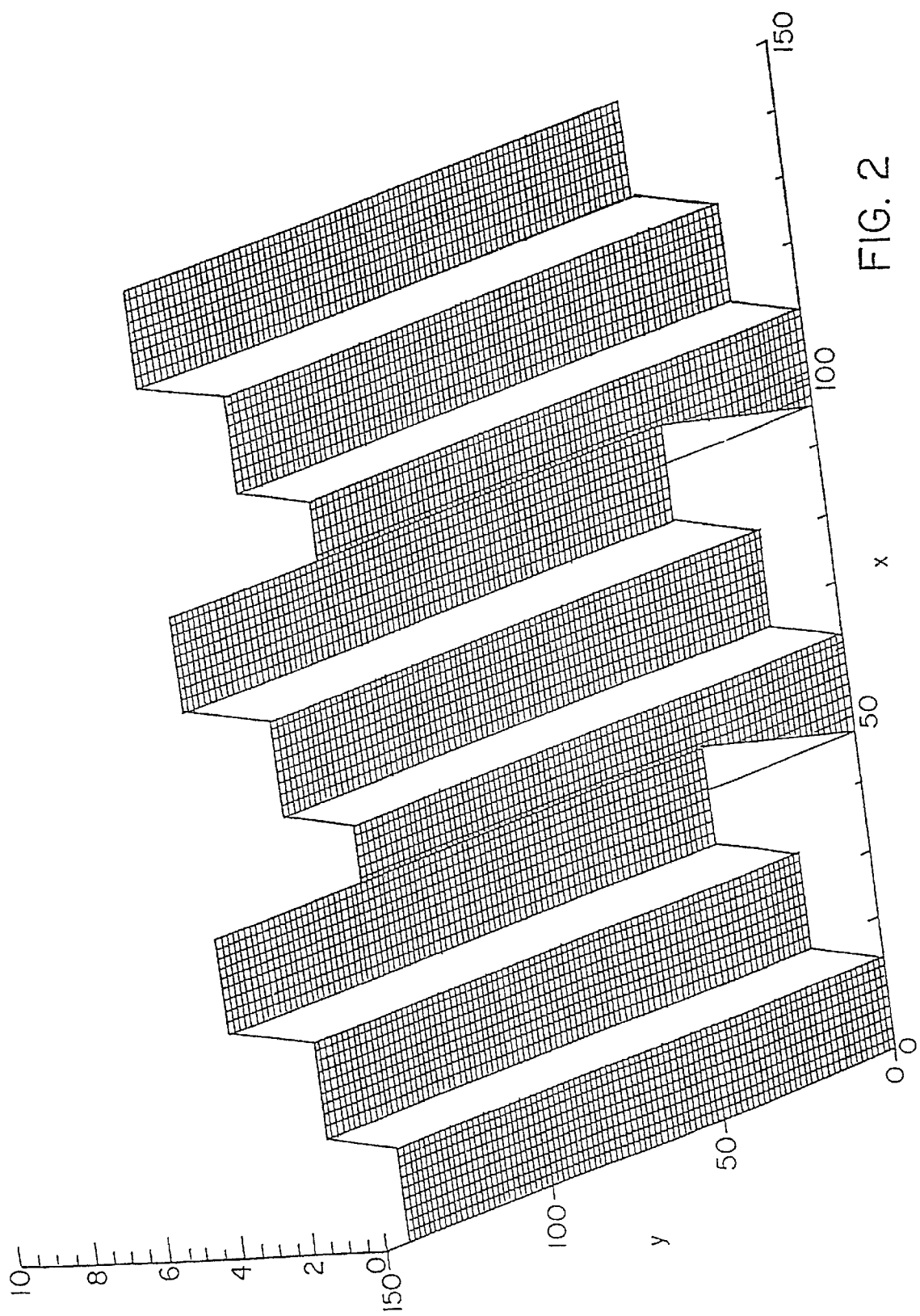
FIG. 2 is a perspective diagram of an embodiment of the multilevel optical phase element.

In making use of such concepts for improving the color projection display efficiency, the above phenomenon can be modified to substantially improve the light throughput thereof. A system embodying the technique in accordance with the invention is shown in FIGS. 1 and 2, wherein a multi-level, e.g., a three-level, phase grating is illuminated with a spectrally broad light from a source 10, such as a tungsten halogen bulb or a xenon arc lamp. Alternatively, the light source may comprise three separate color component sources. For example, three light emitting diodes (LEDs) or three laser sources, each emitting a separate color such as red, green, and blue color components. For the purposes of the particular description of a preferred embodiment of the invention, it is assumed that the illuminating source 10, whether a single broad spectrum source or separate color sources, primarily includes color components of the three wavelength regions, e.g., red, green, and blue. The lateral dimension of each phase level, in one embodiment, is assumed to be equal to the lateral dimension of a sub-pixel region of the spatial light modulator. For illustrative purposes only, FIG. 1A shows only two greatly magnified grating periods, each having corresponding three phase depth levels, occupying the entire aperture. It should be understood that a large plurality of grating periods, each corresponding to a pixel of the overall color image, would normally occupy an aperture.

If it is assumed that a first phase depth level measured with respect to a second phase depth level at each grating period of the phase grating 11 is equal to an integral number of wavelengths of red light plus one-third of such wavelength, i.e. (m+0.33), where m is an integer, and the third phase depth level, again measured with respect to the second phase depth level, is an integer multiple of the wavelength of red light, the red light that is illuminating a three-level phase grating will in effect encounter a binary phase grating with a fill-factor of 33%, and a phase depth of 0.33 wavelengths. The red light will be dispersed from the phase grating 11 into a zero diffraction order and a plurality higher level positive and negative diffraction orders which are focussed on a zero-order phase shifter 13 via lens 12. If the zero diffraction order (undiffracted) is then phase shifted by about 0.33 wavelengths of red light by phase shifter 13, the red light exiting the system will be concentrated via a lens 14 so as to fill only 33% of the output imaging plane 15 (FIG. 1A).

The same methodology as applied above to the red light range can also be applied to the green and blue light ranges. The second phase depth level at each grating period equals zero wavelengths of green light by definition, and the first and third phase depth levels equal (n−0.33) and (n'−0.33) wavelengths of green light, respectively, wherein n and n' are integers. The green light illuminating the phase grating 11 also effectively encounters a binary phase grating with a fill-factor of 33%, and a phase depth of 0.33 wavelengths. If the zero diffraction order is also effectively shifted by about 0.33 wavelengths, the green light exiting the system is concentrated so as to fill the 33% of the output imaging plane that is adjacent to the 33% of the output plane occupied by the red light (FIG. 1A).

For the blue light, the phase depth of level of each grating period, again measured with respect to the second phase depth level, equals (p'+0.33) wavelengths of blue (where p' is an integer), and the first phase depth level is an integer multiple of wavelengths of blue light. The blue light illuminating the grating also in effect encounters a binary phase grating with a fill-factor of 33%, and a phase depth of 0.33 wavelengths of blue light. If the zero diffraction order is also effectively shifted by about 0.33 wavelengths, the blue light exiting the system is concentrated so as to fill the remaining 33% of the imaging plane not occupied by the red light and the green light (FIG. 2).

The above conditions for three discrete wavelengths can in theory be met to any level of accuracy. However, in practice, the accuracy is limited by the physical depths of the grating levels that can be practically manufactured. Furthermore, the system can be designed to operate over the entire visible spectrum, rather than at only three discrete wavelength regions.

The area of chromaticity space spanned by a particular embodiment of the invention depends on the relative depths of the three phase level regions of each grating period corresponding to each pixel, and the depth of the zero-order phase shifter. Since the phase depths are relative, and measured with respect to the second phase depth level, the second phase depth level is zero by definition, thereby leaving three variables: the depths of phase levels 1 and 3 with respect to phase level 2, and the depth of the zero order phase shifter. These three parameters in effect define the performance of the overall system, with the measure of performance being defined as the area of chromaticity space that is so covered. The three depth parameters are most easily optimized by performing a "global search" process that spans the range of practicable manufacturable depths. The goal thereof is to select relative depths which will maximize the area and the location of the spanned chromaticity space. An approach to such process is discussed below.

In considering the first phase level of the grating period, the phase shifts (in waves) ($\Phi_R^1$, $\Phi_G^1$ and $\Phi_B^1$ of the red, green, and blue light can be expressed as:

$$\Phi_R^1 = \frac{d_1}{\lambda_R} (\eta - 1)$$

$$\Phi_G^1 = \frac{d_1}{\lambda_G} (\eta - 1)$$

$$\Phi_B^1 = \frac{d_1}{\lambda_B} (\eta - 1)$$

where $\eta$ is the index of refraction of the phase grating, and $d_1$ is the depth of the first phase level with respect to the second phase level. As mentioned above, it is desired that the phase shift $\Phi_R^1$=m+0.33, while the phase shift $\Phi_G^1$=n−0.33, and the $\Phi_B^1$=p, where m, n, and p are all integers.

In a similar manner at the third phase level, having a depth of $d_3$ with respect to the second phase level, the phase shifts are:

$$\Phi_R^3 = \frac{d_3}{\lambda_R} (\eta - 1)$$

$$\Phi_G^3 = \frac{d_3}{\lambda_G} (\eta - 1)$$

$$\Phi_B^3 = \frac{d_3}{\lambda_B} (\eta - 1)$$

Here, it is desired that the phase shift $\Phi_R^3$=m', the phase shift $\Phi_G^3$=n'−0.33, and the phase shift $\Phi_B^3$=p'+0.33, where m', n', and p' are all integers.

Because the first and third phase levels of the grating are referenced in depth to the second phase level of the grating, by definition, $d_2$=0, and at the second phase level the phase shifts at all three wavelengths is zero:

$$\phi_R^2 = 0$$

$$\phi_G^2 = 0$$

$$\phi_B^2 = 0$$

In addition, at the zero-order phase shifter having a depth of $d_4$, a phase shift of about one-third wavelength of each color is required so that at the phase shifter:

$$\Phi_R^4 = \frac{d_4}{\lambda_R} (\eta - 1)$$

$$\Phi_G^4 = \frac{d_4}{\lambda_G} (\eta - 1)$$

$$\Phi_B^4 = \frac{d_4}{\lambda_B} (\eta - 1)$$

where $\Phi_R^4$=r+0.33, $\Phi_G^4$=s+0.33 and $\Phi_B^4$=t+0.33 (where r, s, and t are integers).

Since the depths of $d_1$, $d_2$, $d_3$, and $d_4$ must be within practical manufacturable limits, the following practical limitations can be imposed thereon:

$-5 \mu m \leq d_1 \leq +5 \mu m$ $-5 \mu m \leq d_3 \leq +5 \mu m$ $-5 \mu m \leq d_4 \leq +5 \mu m$ and the value of $\eta$ can be assumed at a conventional value, for example, of 1.5.

Using the above equations, those in the art can then utilize a well known global search algorithm technique, in which the values of the depths $d_1$, $d_3$, and $d_4$ are changed in steps, $\Delta d$, of approximately 0.01 $\mu$m, and used to determine in each case the area of the chromaticity space that can be spanned for each set of parameters. The depths $d_1$, $d_3$, and $d_4$ for the solution providing a maximized area can then be used as the practical physical depths for the three phase level regions at each phase grating period and the practical physical depth of the zero-order phase shifter 13.

Figure 3:
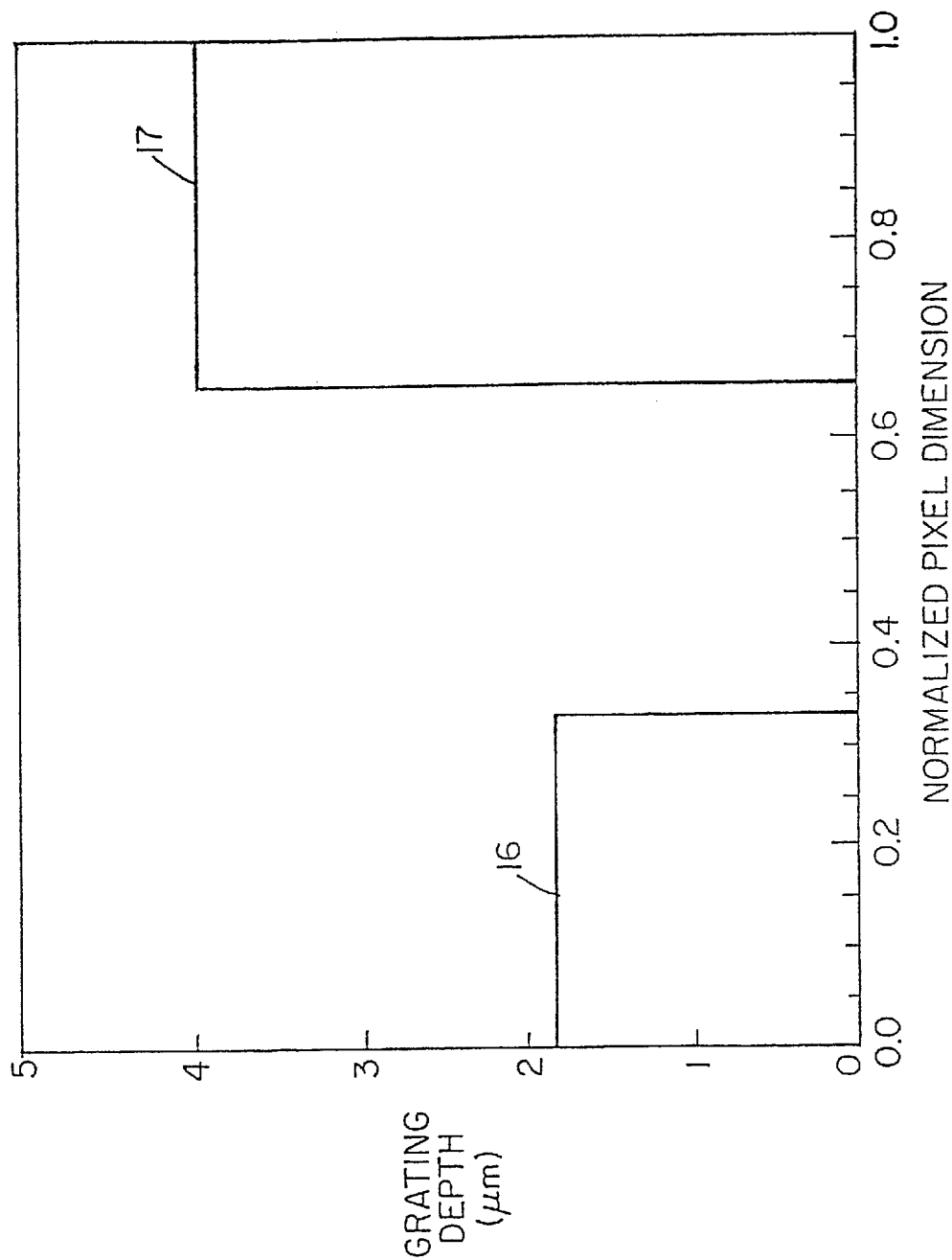
FIG. 3 shows a graph of optimized phase grating depths of three phase levels for a normalized pixel dimension for red, green and blue color channels.

In accordance with a specific embodiment of the invention, such a process was used to determine the three optimum depth parameters for a system operating with a uniform spectral source covering a 0.40–0.68 $\mu$m wavelength region, using both multilevel phase grating and zero-order phase shift substrates assumed to have an index of refraction of 1.5. Exemplary results for optimized sub-pixel phase grating depths of an exemplary pixel having a normalized pixel dimension are shown in FIG. 3, with the red channel having a phase grating depth 16 of 1.84 $\mu$m relative to the green channel, and the blue channel having a phase grating depth 17 of 4.0 $\mu$m relative to the green channel.

Figure 4:
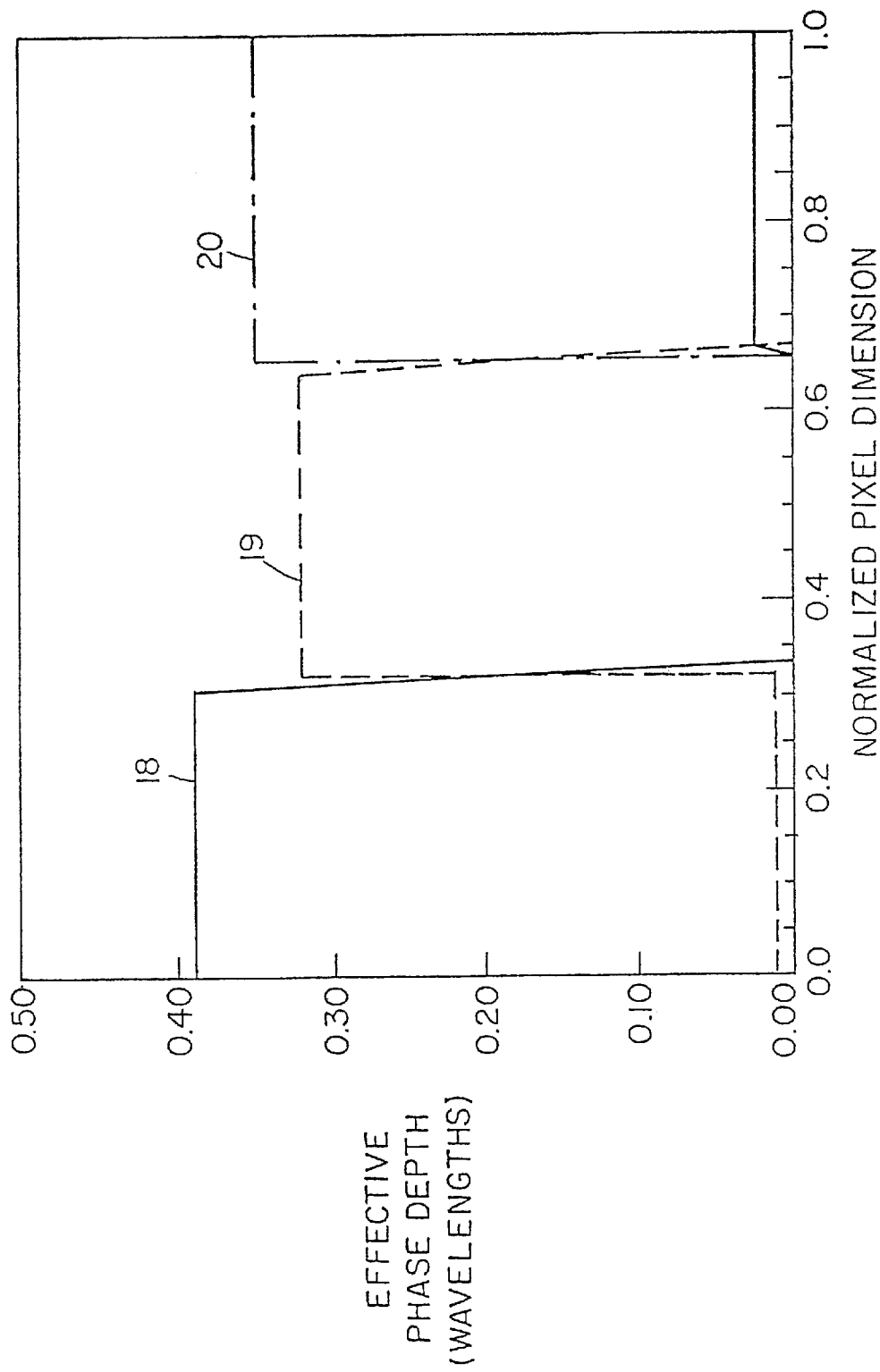
FIG. 4 shows the effective phase grating depths of three phase levels for a normalized pixel dimension for the wavelengths of the red, green and blue color components.

To illustrate how such an optimized phase grating design conforms to the theory described above, the following three discrete wavelengths can be considered: red=0.66 $\mu$m, green=0.54 $\mu$m, and glue=0.46 $\mu$m. The effective phase grating depths (modulo one-wave) of the three sub-pixels at these three phase level regions are shown in FIG. 4, where the solid line 18 represents red, the dashed line 19 represents green, and the dot-dash line 20 represents blue. It should be noted that in the first sub-pixel region, the phase grating depth for red is approximates one-third wavelength of red light, and the phase grating depths for green and blue are essentially zero. Similarly, in the second sub-pixel region, the effective phase grating depth for the green approximates one-third wavelength of green light, and the phase grating depths for red and blue are approximately zero. In the third sub-pixel region, the effective phase grating depth for blue approximates one-third wavelength of blue light, while the phase grating depths for red and green are approximately zero.

Figure 2A:
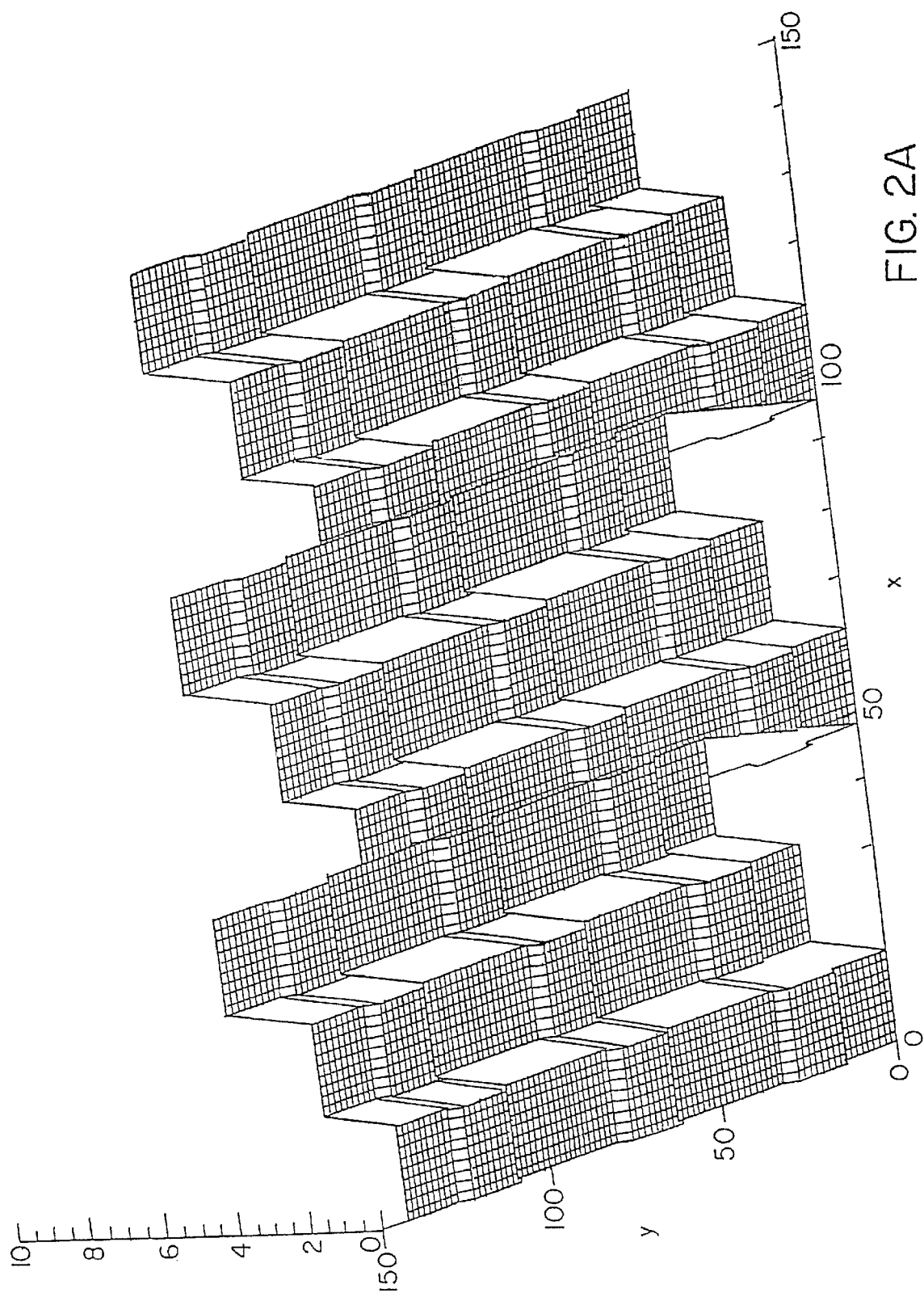
FIG. 2A is a perspective diagram of another embodiment of a multilevel optical phase element of the invention.

The optimized depth for the zero-order phase shifter 13 is 0.36 $\mu$m, which depth corresponds to 0.27 wavelengths of red, 0.33 wavelengths of green, and 0.39 wavelengths of blue. For this example, it is noted that the optimum phase depth is less than one wave for all three wavelengths. FIG. 2 is a perspective view of a multilevel phase element which repeats periodically in the x-direction. FIG. 2A is a perspective view of a multilevel phase element which repeats periodically in both the x and y directions. Such a configuration permits the incident light to be compressed both in the x-direction, as in the prior embodiment, and also in the y-direction. Methods for forming such multilevel phase elements are well known to those skilled in the art. In particular a method for forming such multilevel diffractive optical elements is disclosed in U.S. Pat. 4,895,790 to Swanson and Veldkamp, the teachings of which are incorporated herein by reference.

Figure 5:
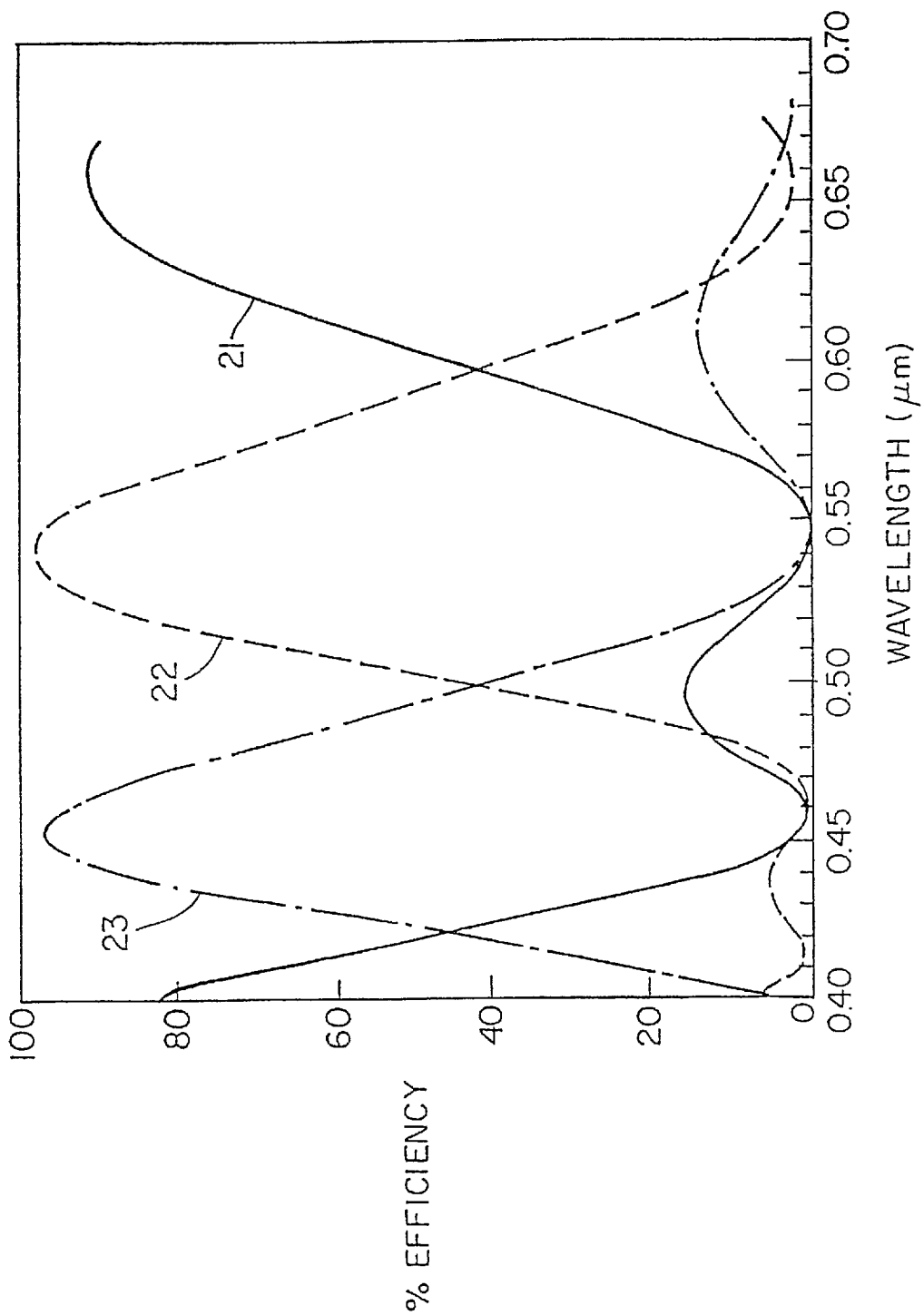
FIG. 5 shows the percent efficiencies of the spectral content for the red, green and blue color components.

The system's ability to concentrate the visible spectrum into three color channels is illustrated in FIG. 5 for the above-mentioned 0.4–0.68 μm wavelength region. The solid curve 21 represents the percent efficiency of the spectral content of the red channel, the dashed curve 22 represents the percent efficiency of the spectral content of the green channel, and the dash-dot curve 23 represents the percent efficiency of the spectral content of the blue channel. It should be noted that the red channel efficiency peaks at the wavelength of 0.66 μm, the green channel efficiency peaks at 0.54 μm, and the blue channel efficiency peaks at 0.46 μm. The red channel has a secondary peak in the far blue region of the spectrum. This blue light, in effect "leaking" into the red channel, tends to limit the area covered in chromaticity space. In some cases, it may be desired or required to remove this unwanted blue light from the red channel by conventionally filtering the red channel and such removal can be achieved with a blue-blocking micro-filter, albeit at the cost of losing a minimal amount of the blue light energy.

Figure 6:
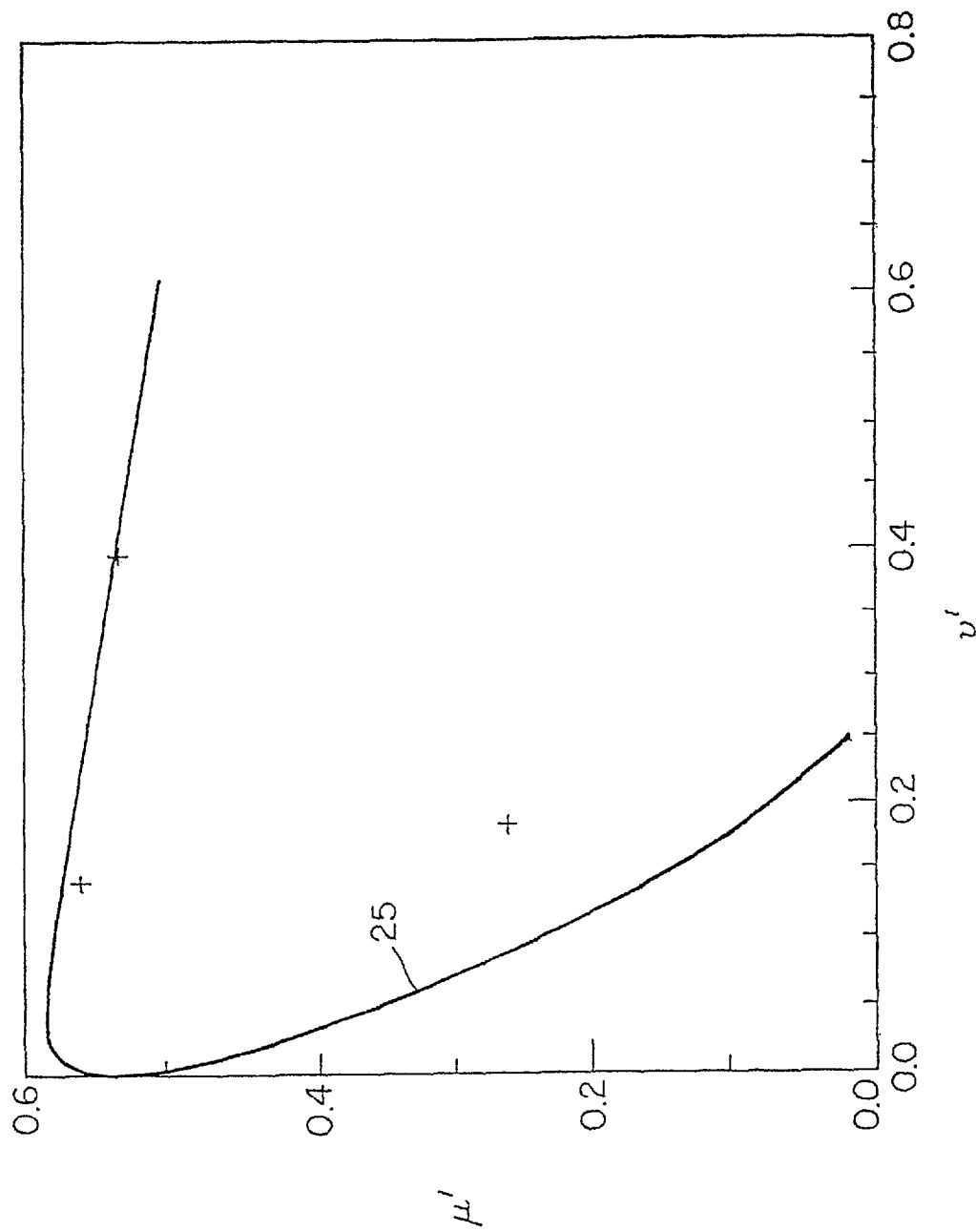
FIG. 6 shows the area of the chromaticity space covered when using a particular embodiment of the invention on a standard 1976 CIE chromaticity graph space.

As is well known to the art, the spectral content of these three color channels can then be used to determine the area of chromaticity space spanned by the system. FIG. 6 shows a standard 1976 CIE chromaticity space graph 25 which is well known to the art. The area of the chromaticity space spanned by the embodiment discussed above is depicted by three vertices of a triangle, defined by the plus signs, in the graph. This area will be covered using essentially 100% of the received source illumination.

Another embodiment of the invention does not require either the zero-order phase plate 13 or the auxiliary optics 12, 14 of the previous embodiment shown in FIG. 1. In this embodiment a broad spectrum light source illuminates a multilevel optical phase element which disperses the broad spectrum light from the light source into diffraction orders. A modulation display, having a number of pixel elements, each capable of transmitting a predetermined spectral region, is positioned within the near field region of a multilevel optical phase element so as to receive the light dispersed by the multilevel phase element. In this embodiment, the free-space propagation of light from the multilevel phase element produces a ⅓ wavelength phase shift of the undiffracted light with respect to the diffracted light. Because of this, the phase plate 13 and auxiliary optical elements 12, 14, which were required to produce the same zero-order phase shift in the previous embodiment, are not required in this embodiment.

To understand how free-space propagation provides the required ⅓ wavelength zero-order phase shift, assume that the amplitude transmittance of the phase grating is expressed as:

$$t(x) = a_o + \Sigma_n a_n \exp\left[ i2\pi \frac{n}{T} x \right]$$

where T is the grating period, $a_0$ is the amplitude of the undiffracted light, $a_n$ is the amplitude coefficients of the various diffracted orders, and n is an indexing parameter.

If a unit amplitude plane wave illuminates this phase grating, the light amplitude distribution, $U_Z$, at a distance Z from the grating plane is described by:

$$U_z(x) = a_o + \Sigma_n a_n \exp\left[ i2\pi \frac{n}{T} x \right] \exp\left[ -i\pi\lambda \frac{n^2}{T^2} Z \right]$$

where λ is the wavelength of the unit amplitude plane wave. The irrelevant constants have been omitted from this equation. Thus the free-space propagation over the distance Z has the effect of introducing phase shifts to the diffracted components with respect to the undiffracted component.

A distance, $Z_{1/3}$, is defined by the equation:

$$Z_{1/3} = \frac{2T^2}{3\lambda}$$

where λ is the central wavelength of the spectral distribution.

Substituting this equation for $Z_{1/3}$ into X in the previous equation, results in the following light distribution:

$$U_{Z_{1/3}}(x) = a_o + \Sigma_n a_n \exp\left[ i2\pi \frac{n}{T} x \right] \exp\left[ -i\frac{2}{3} \pi n^2 \right]$$

The resulting phase shift (for all values of n that do not result in an integer when divided by 3) is equal to an integer number of wavelengths plus ⅓ wavelength. Because the integer number of waves of phase shift are irrelevant, all of the values of n (that do not result in an integer when divided by 3) effectively see a ⅓ wave phase shift with respect to the undiffracted light. For values of n that do result in an integer when divided by 3, the result is an integer number of wavelengths of phase shift. However, for the grating described above, all the values of $a_n$ (for n divisible by 3) are zero.

Thus, the net result of free-space propagation over the distance $Z_{1/3}$ is to produce a light distribution where the undiffracted light is phase-shifted by ⅓ wavelength with respect to the diffracted light. It is at this location that the modulation display, such as a liquid crystal light modulator, is placed. With such a positioning, no phase shift element 13 or additional optics 12, 14 are needed.

It should be noted that the propagation distance $Z_{1/3}$ is a function of wavelength. Therefore, the free-space propagation just discussed is strictly accurate at only one wavelength. However, acceptable performance over the whole visible spectrum may be achieved by choosing the $Z_{1/3}$ distance to correspond to the wavelength at the center of the spectrum. That is, $Z_{1/3}$ should be chosen such that $$\frac{2T^2}{3\lambda_{long}} < Z_{1/3} < \frac{2T^2}{3\lambda_{short}}$$

where $\lambda_{long}$ is the longest wavelength of interest and $\lambda_{short}$ is the shortest wavelength of interest.

The above analysis assumes that the illumination source is a point source at infinity, resulting in plane wave illumination. If the illumination source is such that the approximation of a point source at infinity which was just discussed is not valid, an embodiment which describes a physically extended illumination source must be considered.

Figure 7:
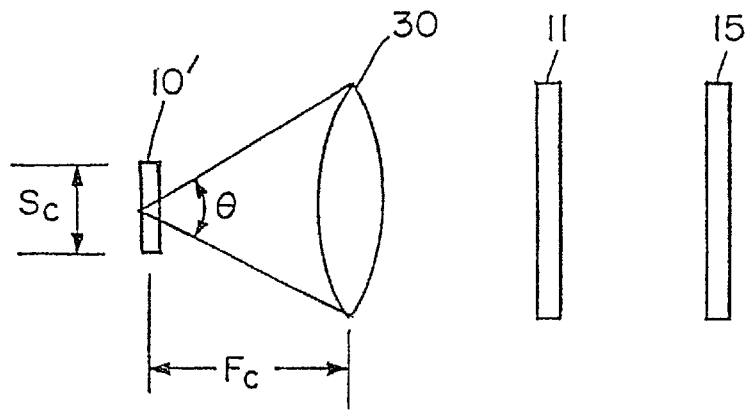
FIG. 7 is a block diagram of another embodiment of a display system of the invention.

In this embodiment, shown in FIG. 7, an illumination source 10' has a dimension (for purposes of discussion referred to as the x-dimension) of $S_c$. A condensing lens 30 having a focal length of $F_c$, is positioned adjacent the illumination source 10', at a distance of $F_c$. This configuration results in an angular source extent in the x-dimension of $\theta_c \approx S_c/F_c$.

A figure of merit for performance is the ratio b/T, where b, the blur, is the physical extent of the light pattern at the display location in the x-dimension and T is the grating period. For good performance, this ratio is less (typically much less) than ⅓. If b is given by the expression $b = Z_{1/3}\theta_c$, the figure of merit becomes:

$$\frac{b}{T} = \frac{2T}{3\lambda_o} \theta_c$$

where $\lambda_o$ is the center wavelength. For example, if an acceptable figure of merit is ⅙, the center wavelength is 0.55 micrometers, and the grating period is 48 micrometers, the resulting value for the angular source size is $\theta_o$=2.9 milliradians. Thus, for a 50 mm focal length condensing lens, a source with a size no larger than 145 μm in the x-dimension is required for this figure of merit to hold. Hence, a source 10' with a physical dimension smaller than most commercially available broad-spectrum incoherent sources should be used to obtain good performance. Although broad spectrum incoherent sources of the dimension just described are not generally available, three spatially coherent monochromatic sources, such as three different wavelength LED's or laser diodes, could readily be used as the illumination source 10'. As discussed with respect to the previous example, the modulation display is preferably placed at a distance $Z_{1/3}$ from the multilevel phase element 11.

Figure 8:
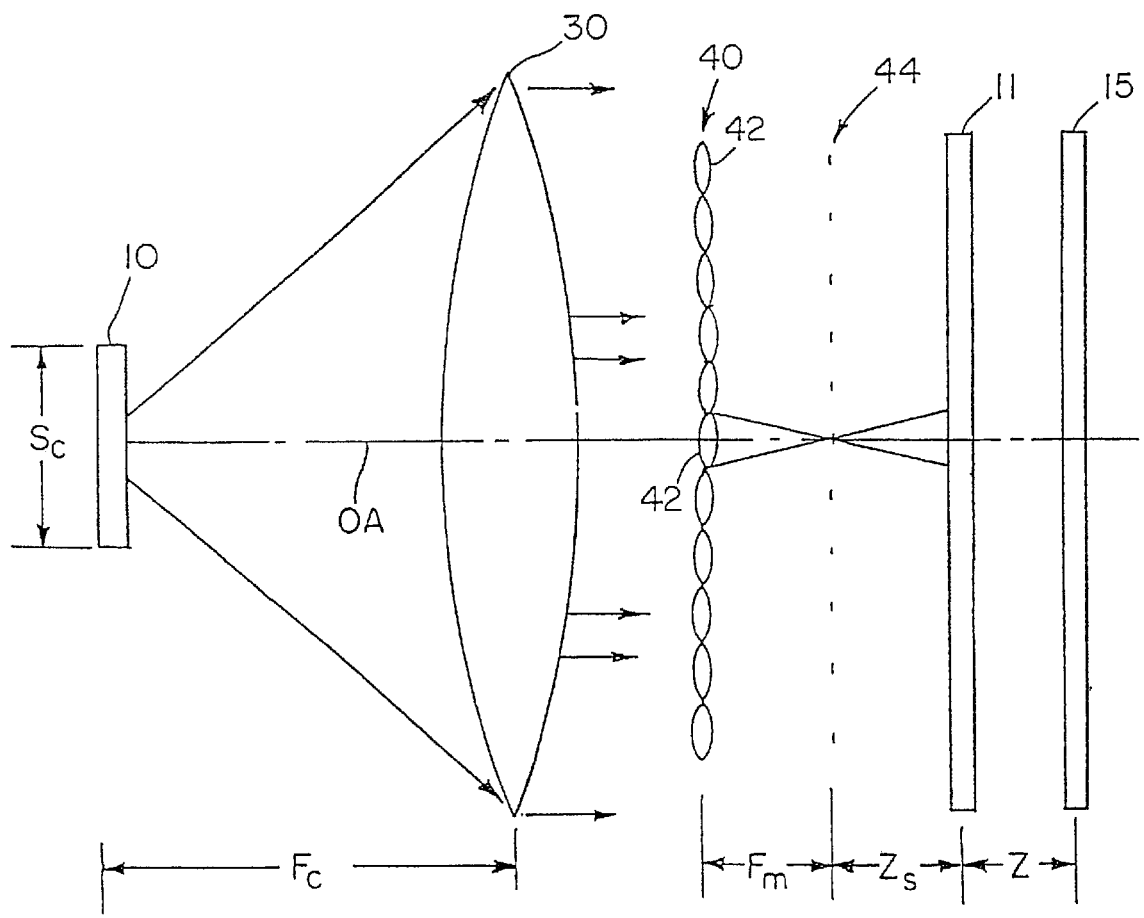
FIG. 8 is a block diagram of yet another embodiment of a display system of the invention.

Referring to FIG. 8, an embodiment which increases the extended source performance includes a lenslet array 40 (in one embodiment cylindrical lenslets), placed between the condensing lens 30 and the multilevel phase element 11. The focal length of each lenslet 42 is $F_m$, and the distance between the lenslet array 40 and the multilevel phase element 11 is $Z_s+F_m$. Thus, $Z_s$ is the distance between the imaged source 22 and the multilevel phase element 11. Each lenslet 42 focusses an image 44 of the extended source, $S_c$, at a distance $F_m$ from the lenslet array 40. Each of these imaged sources 44 is of physical dimension, $S_m$, in the x-dimension, where $S_m=(F_m S_c)/F_c$ centered about the optical axis of the respective lenslet 42.

For an image 44 of dimension $S_m$ that lies on the optical axis of the condensing lens, a Fresnel diffraction calculation indicates that the light amplitude distribution at a distance Z from the multilevel phase element 11 is given by the expression:

$$U_{z(x)} = \exp\left[i\frac{\pi}{\lambda}\frac{x^2}{Z+Z_s}\right]\left[a_o + \Sigma \exp\left[-i\pi\lambda\frac{n^2}{T^2}\frac{Z_sZ}{Z+Z_s}\right]\exp\left[-i2\pi\frac{n}{T}\frac{Z_s}{Z+Z_s}x\right]\right]$$

in which the irrelevant constant factors have been neglected. The first exponential term in the series is the wavefront curvature introduced by the lenslet 42. The first exponential term after the summation sign represents the phase shifts incurred by the various diffraction orders. Again, what is desired is for all of the phase shifts for value of n which do not result in integers, when divided by three, be equal to ⅓ wave. For this to be the case, Z must be given by the expression:

$$Z = \frac{2T^2Z_s}{3\lambda Z_s - 2T^2}$$

Hence, in a manner similar to the case without lenslets, the value of z should be chosen such that:

$$\frac{2T^2Z_s}{3\lambda_{long}Z_s - 2T^2} < Z < \frac{2T^2Z_s}{3\lambda_{short}Z_s - 2T^2}$$

wherein T is the periodicity of said multilevel optical phase element, $Z_s$ is equal to the distance between said multilevel optical phase element and said lenslets minus the focal length of said lenslets, $\lambda_{long}$ is the longest wavelength of interest and $\lambda_{short}$ is the shortest wavelength of interest.

Comparing this relationship with the relationship previously shown for $Z_{1/3}$ (the optimum distance for the plane wave illumination case):

$$\frac{Z_{1/3}}{Z} = 1 - \frac{2T^2}{3\lambda Z_s}$$

As $Z_s$ approaches infinity, the distance, Z, approaches $Z_{1/3}$, as is expected. For finite source distance $Z_s$, the optimum Z distance is greater than the plane wave distance $Z_{1/3}$.

The last exponential term indicates that the period of the light distribution at the optimum Z distance is no longer equal to the period of the original phase grating. In effect, free-space propagation from a source 10' located a finite distance from the grating 11 results in a magnification. This magnification, M, is given by the equation:

$$\frac{1}{M} = 1 - \frac{Z}{Z_s}$$

Note that for a finite source definition, $Z_s$, the magnification factor is greater than one.

The angular source size of the extended source 10 as seen at the grating 11, $S_m/Z_s$. This angular source size results in a new blur dimension, $b_n$, given by the expression:

$$b_n = \frac{S_m}{Z_s} Z = \frac{2T^2}{3\lambda Z_s - 2T^2} S_m$$

Because of the magnification described above, the new period of the image pattern is, $T_n$:

$$T_n = MT = \frac{3\lambda Z_s T}{3\lambda Z_s - 2T^2}$$

The resulting fractional blur of the image pattern can now be described by the relationships:

$$\frac{b_n}{T_n} = \frac{2T}{3\lambda Z_s} S_m = \frac{2T}{3\lambda Z_s} \frac{F_m}{F_c} S_c$$

The fractional blur, with the lenslet array 40 in position, can be directly related to the fractional blur, b/T, without the lenslet array 40, according to the expression:

$$\frac{b_n}{T_n} = \frac{b}{T} \frac{F_m}{Z_s}$$

This relationship clearly shows that the blurring can be dramatically reduced by the proper introduction of the lenslet array 40. The reduction factor of the blurring is the ratio $F_m/Z_s$.

So far, consideration has only been given to the one lenslet 42 centered on the optical axis (OA) of the condensing lens 30. Additional lenslets placed adjacent to the original lenslet 42 behave in a manner identical to that described above for the original lenslet 42. However, because of a coherent interaction between the light traversing different lenslets, an additional constraint is placed on the allowable center-to-center spacings of the lenslets. The minimum center-to-center spacing distance of the lenslets, L, is given by the expression:

$$L = pT\left(\frac{Z+Z_s}{Z}\right)$$

where p is a positive integer.

Figure 9:
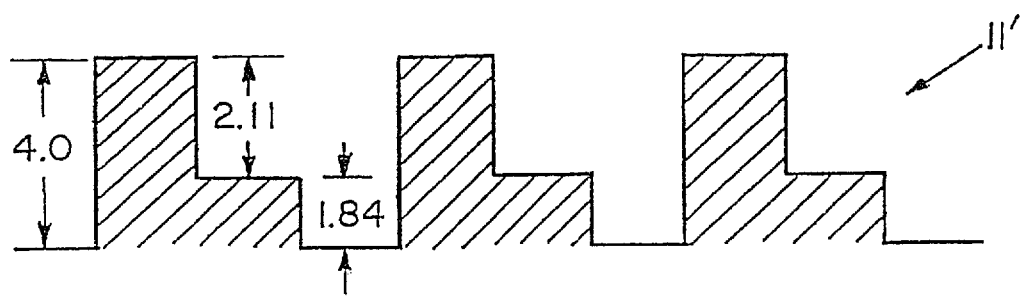
FIGS. 9 and 9A are block diagrams of a multilevel phase element and its complex conjugate, respectively.

In another embodiment, the multilevel phase element 11' shown in FIG. 9, and discussed above with respect to FIG. 3, includes a double step having an aggregate height of 4.0 µm. The first step is 1.84 µm measured from the base of the phase element and the second step is 2.16 µm measured from the top of the first step to the top of the phase element. A phase element constructed with these dimensions functions as described above.

Figure 9A:
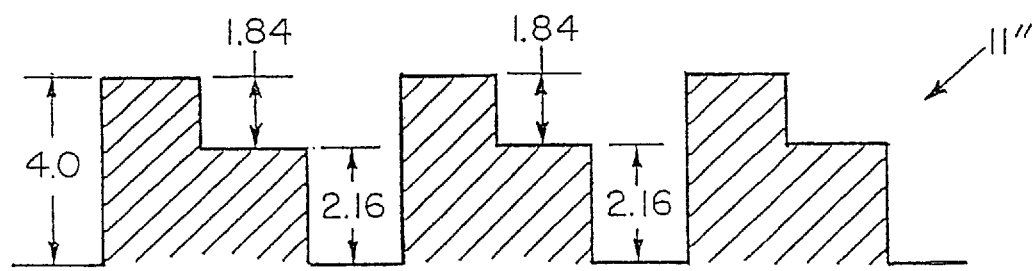

If instead of the phase element 11' shown, a complex conjugate phase element 11" as shown in FIG. 9A is constructed, the complex conjugate phase element 11" performs equivalently to the phase element 11'. The reason for referring to phase element 11" as a complex conjugate phase element becomes readily apparent if the complex conjugate phase element 11" is placed adjacent the phase element 11' such that the steps are aligned. Light passing through both phase elements is unaffected, and thus, just as the integration of a wavefunction by its complex conjugate equals one, phase element 11" acts as the complex conjugate to phase element 11, thereby permitting the incident light to pass both elements through unaffected.

Unlike the phase element 11', the complex conjugate phase element 11" $Z_{1/3}$ is defined by:

$$Z_{1/3} = \frac{T^2}{3\lambda}$$

wherein λ is the central wavelength of the spectral distribution.

Acceptable performance over the whole visible spectrum may be achieved by choosing the $Z_{1/3}$ distance to correspond to the wavelength at the center of the spectrum.

$$\frac{T^2}{3\lambda_{long}} < Z_{1/3} < \frac{T^2}{3\lambda_{short}}$$

where $\lambda_{long}$ is the longest wavelength of interest and $\lambda_{short}$ is the shortest wavelength of interest. Similarly, when lenslets are employed in conjunction with the complex conjugate phase element 11", Z must be chosen such that:

$$\frac{T^2 Z_s}{3\lambda_{long} Z_s - T^2} < Z < \frac{T^2 Z_s}{3\lambda_{short} Z_s - T^2}$$

wherein T is the periodicity of said multilevel optical phase element, $Z_s$ is equal to the distance between said multilevel optical phase element and said lenslets minus the focal length of said lenslets, $\lambda_{long}$ is the longest wavelength of interest and $\lambda_{short}$ is the shortest wavelength of interest. Thus, using a complex conjugate phase element permits a closer spacing than is permitted by the non-complex conjugate phase element.

The above-described phase plates can be fabricated using a number of techniques including, but not limited to, lithography, direct writing, deposition, diamond turning, grating ruling engine, or laser ablation.

Figure 10:
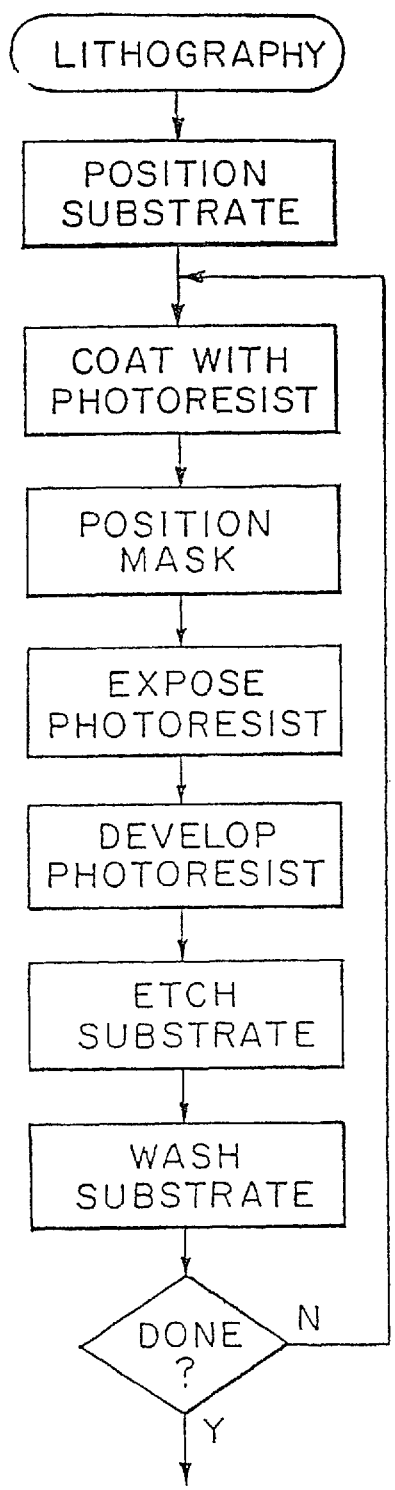
FIG. 10 is a flow chart illustrating a lithographic method of fabricating the phase plates.

FIG. 10 is a flow chart illustrating a lithographic method of fabricating the phase plates. The phase plate is preferably fabricated using a lithographic mask along with standard photoresist and etching techniques used in semiconductor fabrication processes. Preferably, an optical substrate (which will become the phase plate) is coated with a layer of photoresist. A lithographic mask is then used to selectively expose the photoresist over desired areas of the substrate. The photoresist is then developed, where it is removed from the exposed areas. The substrate is then etched by one of many etching processes (e.g., reactive ion etching, ion milling, chemical wet etch) to the desired depth of one of the phase levels. The residual photoresist is then washed off, leaving the substrate surface with two phase levels. Repeating the above procedure for a second lithographic mask results in a substrate having three phase levels. The process can be continued until the desired number of phase levels are achieved.

Figure 11:
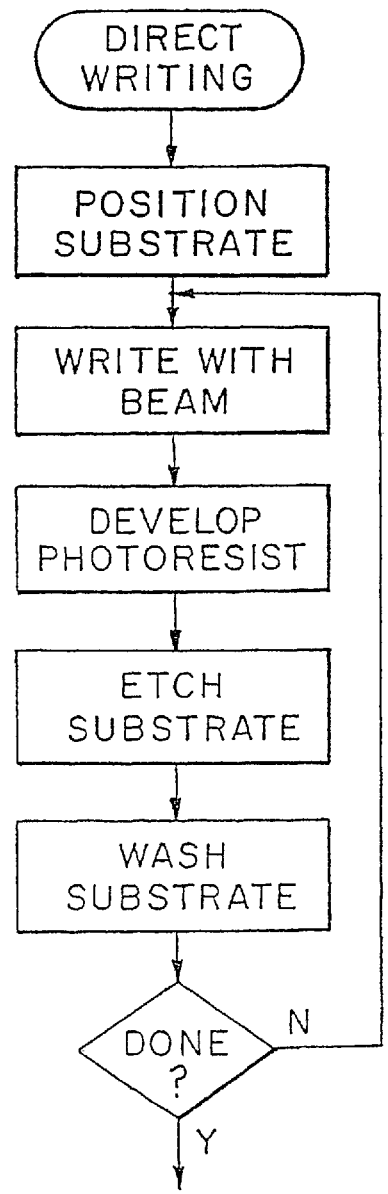
FIG. 11 is a flow chart illustrating a direct writing method of fabricating the phase plate.

FIG. 11 is a flow chart illustrating a direct writing method of fabricating the phase plate. Direct writing is a variation of the above fabrication procedure to expose the photoresist. Direct writing refers to the process whereby an exposing beam, such as electron or laser beam, is scanned across the surface of the substrate. The beam is turned on or off depending on whether or not the photoresist is to be exposed at the particular substrate location.

There are two methods of direct writing which can be used. The first direct writing method uses direct writing to essentially duplicate the lithographic mask technique. Each direct write iteration results in an addition of a phase level to the substrate surface. A second method of direct writing varies the expose energy of the exposing beam as a function of position. In other words, instead of simply turning the beam on or off, the beam energy can be modulated to the correct gray scales in the photoresist. This process will result in a photoresist profile that has as many levels as the desired phase plate. If done properly, a single etching step results in the photoresist profile being transferred onto the substrate.

Figure 12:
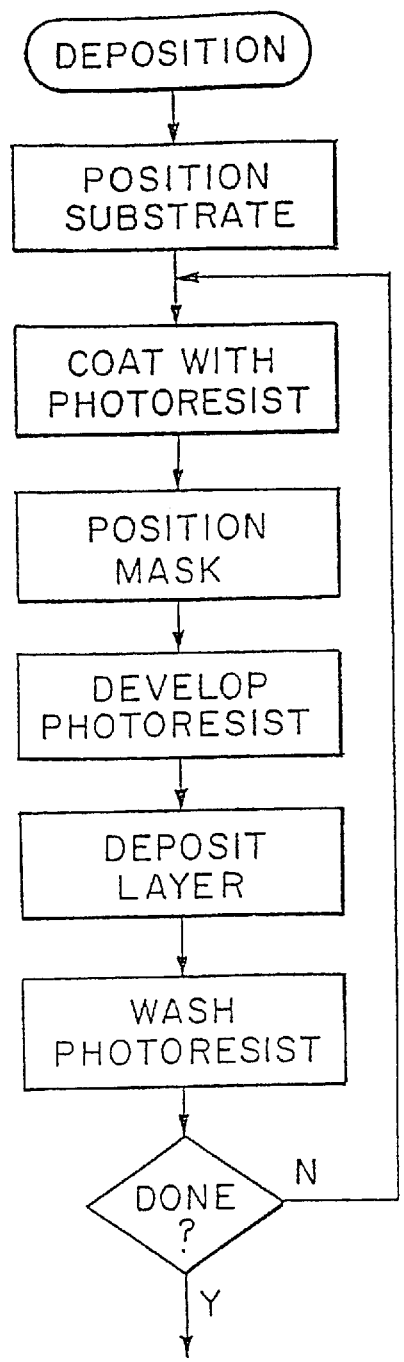
FIG. 12 is a flow chart illustrating a deposition method of fabricating the phase plates.

FIG. 12 is a flow chart illustrating a deposition method of fabricating the phase plates. In this fabrication process the phase levels are deposited onto the substrate surface, rather than etched into the substrate. In this process, the optical substrate is coated with a layer of photoresist. A lithographic mask is then used to selectively expose the photoresist over the desired areas of the substrate. The photoresist is then developed, where it is removed from the exposed areas. Material is then deposited on the surface of the substrate by one of many deposition processes (e.g., evaporation, sputtering) to the desired depth of one of the phase levels. The residual photoresist is then washed off leaving a substrate surface with two phase levels. The above procedure can be repeated with a second lithographic mask which leaves a substrate with three phase levels. The process can be continued until the desired number of phase levels are achieved.

Any of the above processes can be used to fabricate a master element. The master element can then be used to produce a mold from which numerous replicas can be made. Potential replication processes include injection molding, compression molding, embossing, and precision glass molding.

Although the lenslet array described above is optically efficient, they require a complex fabrication process. Consequentially lenslets are expensive to manufacture. An optical system is therefore needed that uses less complex, and therefore inexpensive, optical elements. Other preferred embodiments of the invention employ a mask element in place of a lenslet array.

FIG. 13 is a graphical representation of a constant amplitude wavefront interfacing with an aperture in a mask element. The mask element 50 includes an aperture or opening 56. The opening 56 may be either a slit or square, as will be described in further detail below. Upon striking the mask element 50 only light incident on the opening 56 passes through the mask element 50. The opening 56 appears to be an individual light source with wavefronts 70 propagating outwardly. In the image plan defined by the mask element 50, the exiting wavefront 71 is in phase, but the amplitude varies in a step fashion. As the wavefront propagates from the opening 56, the wavefront shifts in phase because the varying distance from the opening 56 to another image plane is manifested as a phase shift.

Where there are multiple openings 56 on the mask element 50, multiple wavefronts propagate from the various opening 56 and interfere with each other. In that case, the wavefronts of light at the image plane of the phase plate 80, now have a constant amplitude, but are out-of-phase. That is because light incident on any particular point on the phase plate 80 has arrived from multiple openings 56 of the mask 50, each of which is located at a different distance from the point of interest.

The phase plate 80 disperses the incoming wavefront into wavelength components. Illustrated are red components 82, green components 84 and blue components 86 as dispersed by the phase plate 80. The dispersed color components 82, 84, 86 impinge on respective sub-pixels 92, 94, 96 of an LCD panel 90.

FIG. 14 is a schematic diagram of a transmissive display system employing a mask element. The display system 100 includes a light source 105, a masked plate 110, a phase plate 120, an LCD panel 130. In addition, other optical elements can be disposed between the light source 105 and the phase plate 120. The light source 105 is preferably a lamp with a parabolic reflector. The parabolic reflector insures that the light source 105 generates parallel light rays. The parallel light rays impinge on the masked plate 110 and the wavefronts of light from the masked plate 110 impinge on the phase plate 120.

As described above, the phase plate 120 separates the impinging light into red, green and blue wavelength components and directs those wavelength components onto respective sub-pixels of the liquid crystal display panel 130. By driving the liquid crystal display panel 130 with control circuitry (not shown), the sub-pixels can be valved so as to generate a color image across the face of the display panel 130. The displayed image can either be projected onto a viewing surface or directly viewed by a viewer.

FIG. 15 is a foreshortened cross sectional schematic diagram of the masked plate 110 of FIG. 14. The masked plate 110 includes a glass substrate 112 having an alternating pattern of mirrors 114 and openings 116 on the distal side (relative to the light source 105). The mirrors 114 can alternatively be placed on the proximal side of the glass substrate 112 (relative to the light source 105). The glass substrate 112 can be heat absorbing, liquid cooled, or coated on either side with an infrared and ultraviolet rejection filter. The glass substrate 112 can also be coated on either side with dichroic notch filters. Preferably, there is also a color rejection filter to reflect or absorb wavelength of light that are not desired for display, such as an orange and yellow rejection filter. Although the color rejection filter can be placed anywhere before the LCD panel 130, it is preferably integrated with an infrared and ultraviolet filter as a single filter.

As illustrated, the linear ratio of the area of the openings 116 relative to the mirrors 114 is 50%. Consequently, in the illustrated section only one third of the light exiting the light source 105 can exit the masked plate 110 on the first attempt. The mirrors 114 reflect the light back into the light source 105 to be reclaimed and reflected off from the parabolic reflector, thereby increasing the chance that an individual light ray eventually exits an opening 116 instead of being dissipated within the light source 105 and mask element 110.

FIGS. 16A–16B are schematic front views of the masked plate 110 of FIG. 14. FIG. 16A illustrates a masked plate 110' having slit openings 116' between mirror bars 114'. FIG. 16B illustrates a masked plate 110" having, a mirror 114" perforated with square openings 116". Regardless of which embodiment is used, there is always a 2:1 ratio of mirrors 114 to openings 116 in either or both directions. In the one-dimensional grating of FIG. 16A, one third of the light from the light source 105 (plus any reclaimed light) is passed through the masked plate 110'. For the two-dimensional grating of FIG. 16B only one ninth of the light from the light source 105 (plus any reclaimed light) exits from the masked plate 110". The efficiency of the attempt to reclaim light is dependent on the quality of the mirrors 114 on the masked plate 110 and the reflectivity and shaping tolerances of the reflector of the light source 105.

Although less light escapes from the two-dimensional grating of FIG. 16B, that light can be concentrated onto individual pixel areas of the liquid crystal display panel 130. The one-dimensional grating of FIG. 16A, however, wastes light by placing light energy in the black areas between the pixel electrodes. The choice between a one-dimensional grating and a two-dimensional grating is thus a system tradeoff between light collection efficiency and transmission efficiency through the LCD panel 130.

Preferably, the openings 116 in the masked plate 110 are much larger than the wavelengths of the light. Consequently, the diffraction of light from the openings 116 is limited. However, the 2:1 ratio of mirror to openings efficiently handles any diffraction by assuring that the wavefronts mesh together on the phase plate 120. That is because the diffractive orders from the mask element 110 match the phase gratings on the phase plate 120. Although a 1:2 ratio is illustrated for a three color display, a 1:1 ratio can be used for a monochrome display. It should be noted that there is a fundamental limit of a 1:3 ratio between openings and mirrors, which allows the use of four different areas of the light spectrum such as red, green, blue and black colors in a display.

Figure 17:
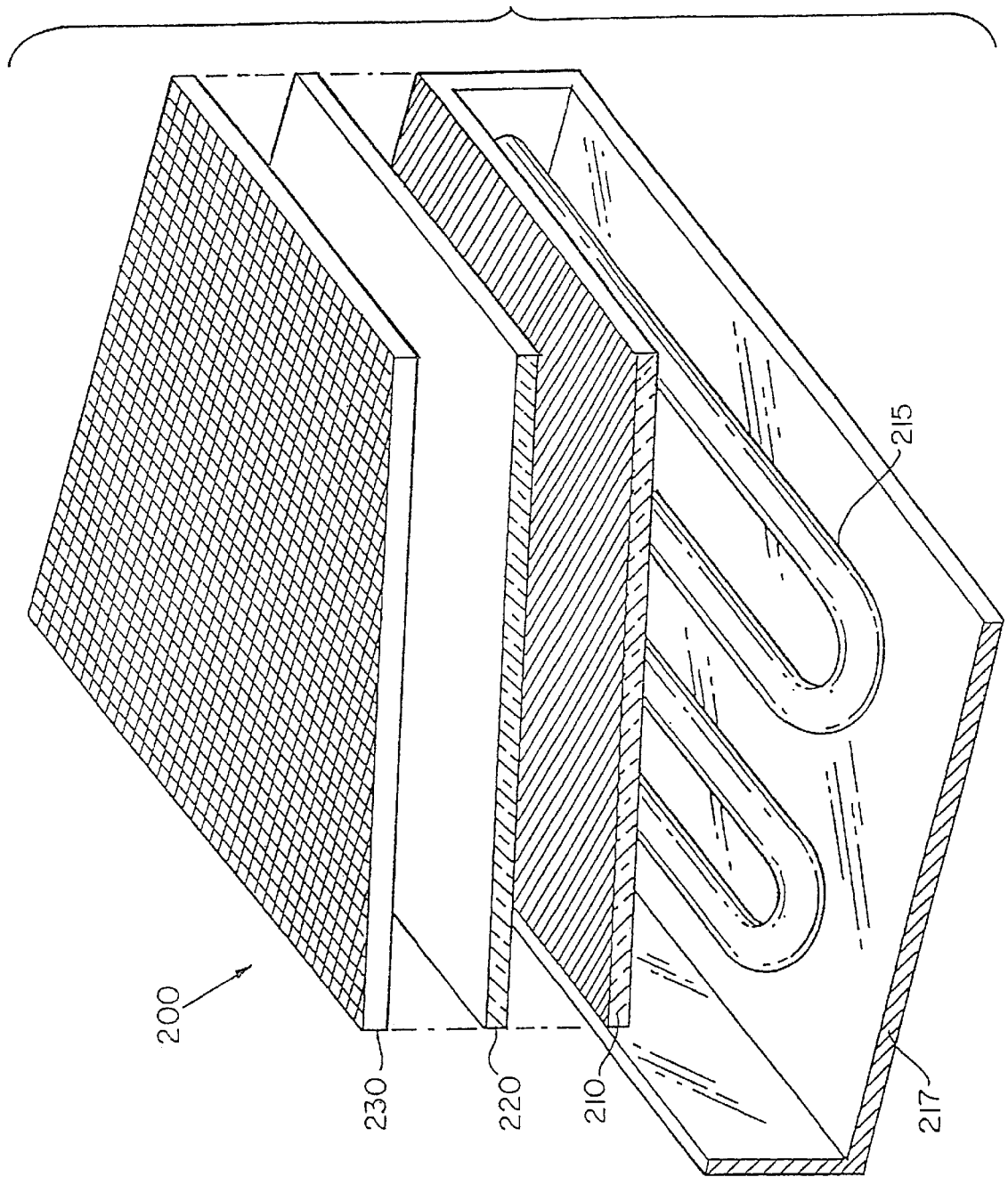
FIG. 17 is a perspective cross sectional schematic diagram of another preferred embodiment of the invention employing a reflective box light source as a backlight.

FIG. 17 is a perspective cross sectional schematic diagram of another preferred embodiment of the invention employing a reflective box light source as a backlight. Fluorescent lamp elements 215 (or another suitable light source) are encased within a reflective box 217, which, for example, can be either a specular reflector having a mirrored inside surface or a non-specular reflector having a highly reflective white inside surface. Light from the reflective box 217 passes through a masked plate 210, which is fabricated as described above. A phase plate 220 is separated from the masked plate 210 and an LCD panel 230 is separated from the phase plate 220. The reflective box 217 for a LCD panel having a pixel pitch of 16–24 μm is less than 0.42 cm in thickness, the phase plate 220 is about 0.7 mm in thickness and the LCD panel 230 is about 1.5 mm thick. The spacings between the elements are on the order of 1 mm with a tolerance of about 0.025 mm. The LCD panel 230 can include one or two polarizers. As with the embodiment of FIG. 14, the reflective box display system 200 can include a viewing lens for head-mounted or other direct viewing of the image formed on the LCD panel 230.

Figure 18A:
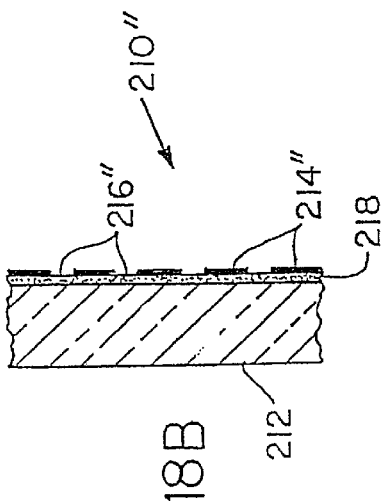
FIGS. 18A–18B are foreshortened cross sectional views of the masked plate 210 of FIG. 17.
Figure 18B:
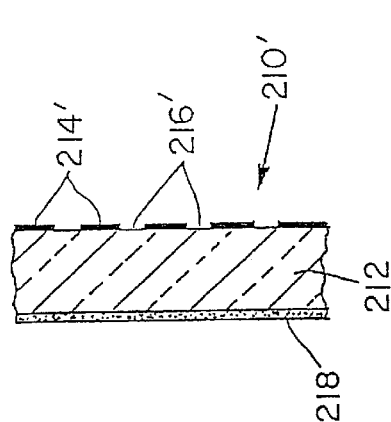

FIGS. 18A–18B are foreshortened cross sectional views of the masked plate 210 of FIG. 17. As illustrated the masked plate 210', 210" is coated with a diffusing surface to scatter incident light from the reflective box 217. The diffusing coating helps to more evenly distribute the light from the reflective box 217. As illustrated, the diffusing coating 218 can be on the proximal side of the glass substrate 212 (FIG. 18A) or on the distal side of the glass substrate 212 (FIG. 18B). The defusing coating can also be on either side of the mirrors. In either embodiment, the mask includes alternating mirrors 214 and openings 216 as described above; the openings 216 can either be one-dimensional slits or two-dimensional squares. In either case, there is a 1:2 ratio of openings 216 to mirrors 214, in either or both directions. As above, the glass can be heat absorbing, coated on either side with infrared and ultraviolet rejection filters, or coated on either side with dichroic notch filters.

A continuing problem is the need to evenly distribute light across the face of the LCD panel. One approach to solving this problem is to use a light pipe as will be described in more detail below.

Figure 19:
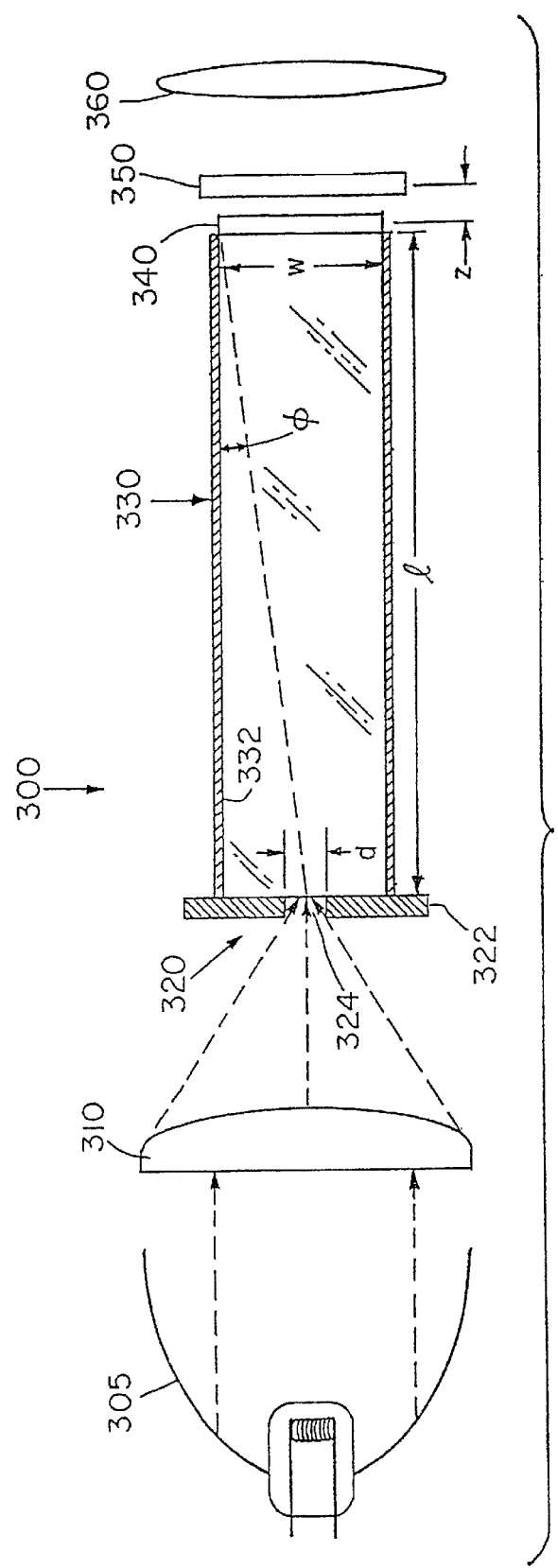
FIG. 19 is a schematic diagram illustrated a preferred embodiment of a display system having a light pipe.

FIG. 19 is a schematic diagram illustrated a preferred embodiment of a display system having a light pipe. The display system 300 includes a parabolic light source 305 which is a lamp with a parabolic reflector. Alternatively, the light source can include a elliptical reflector. Where the light source 305 includes a parabolic reflector a condenser lens 310 is used to focus the light from the light source 305 through an aperture 324 of a light pipe assembly 330. The aperture 324 is formed in a mask 320 having blocking elements 322. The light pipe terminates at an abutting phase plate 340 as described above. The image plane of a LCD panel 350 is separated from the image plane of the phase plate 340 by a distance z. A projection lens 360 projects the image form on display panel onto a viewing surface and disposed at the center of the opening to the light pipe 330.

The light pipe assembly 330 includes four reflective surfaces 332 which cooperate to create a light guide or pipe. The light pipe is dimensioned so as to evenly mix the light from the aperture 324 before the light reaches the phase plate 340. The light pipe is a distance l long and has a width w. The ratio of the width w to the length l is $$\tan(\phi) = \frac{w}{2l},$$

where $\phi$ is the angle from the end edge of the light pipe 330 and the center of the aperture 324. However, $$\frac{w}{2l} = \frac{T}{z},$$

when T' is the distance between pixel centers. The length of the light pipe 330 is thus $$l = \frac{wz}{2T}$$

The aperture is preferably square with a dimension d which is defined as $$d \leq \frac{w}{3}$$

The light pipe 320 is preferably a rod having a rectangular cross section and fabricated from optical glass with reflective surfaces on the peripheral surface of the rod. The output ratio of the light pipe 320 must match the square aperture 324 at the proximal end and the rectangular phase plate 340 at the distal end.

Figure 20:
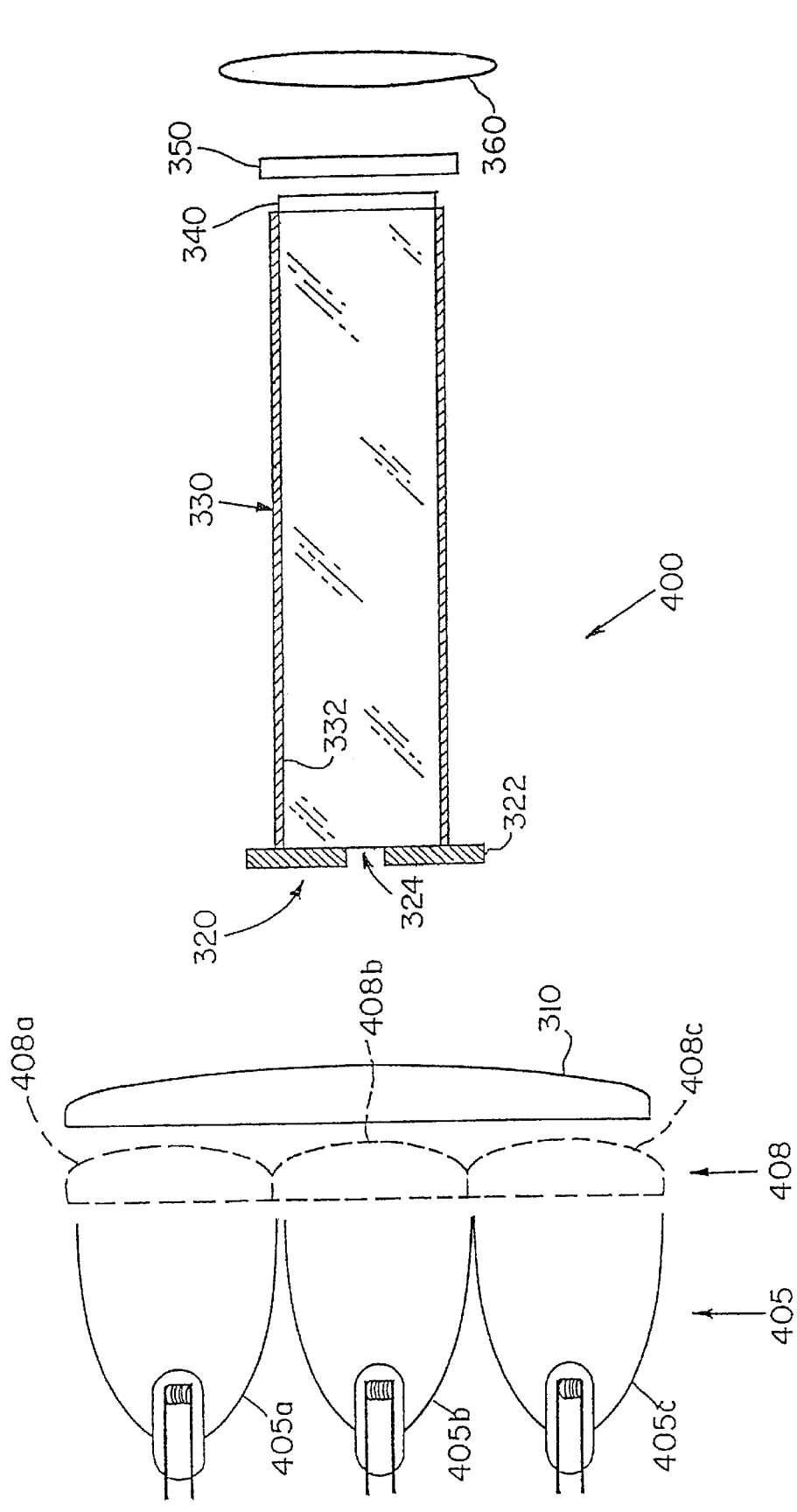
FIG. 20 is a schematic diagram of a preferred embodiment of a display system having multiple light sources.

FIG. 20 is a schematic diagram of a preferred embodiment of a display system having multiple light sources. As described above, the display system 400 includes a light pipe assembly 330 with a phase plate 340, an LCD panel 350 and a projector lens 360.

Unlike the embodiment of FIG. 19, the display system 400 of FIG. 20 includes multiple light sources 405 which can be used in a linear or rectangular array. The use of multiple lamps permits the use of small, efficient, and less expensive light sources. Furthermore, the light output of the system can be tuned by varying the number of lamps in the array. Illustrated are three lamps 405a, 405b, 405c. Depending on the type of reflector used in the light sources 405, a matching lens array 408 (shown in phantom) may be needed to collimate the light into parallel light rays. As illustrated, there is one lens 408a, 408b, 408c for a respective light source 405a, 40b, 405c. A condenser lens 310 focuses the parallel light rays from the light sources 405 onto the aperture 324 and subsequently through the light pipe 330.

FIG. 21 is a schematic diagram of a preferred embodiment of a display system having a changed aspect ratio. The display system 500 incorporates a light pipe assembly 530 which changes the aspect ratio from a square aperture 524 to a rectangular face plate 340. In all other respects a display system 500 is identical to the display system 300 of FIG. 19.

The above described light pipe application requires a relatively long light pipe assembly, which restricts their application with head-mounted display systems. Instead, they are primarily useful on projection display systems. The length of the light pipe, however, can be reduced by increasing the number of apertures into the light pipe.

FIG. 22 is a schematic diagram of a preferred embodiment of display system having a multiple aperture light pipe in accordance with the invention. The display system 600 includes a light source 305, a condenser lens array 610 and a light pipe assembly 630. The light pipe assembly 630 includes a mask 620 having four apertures 624a, 624b, 624c, 624d. There is one condenser lens 610a, 610b, 610c 610d for a respective aperture 624a, 624b, 624c, 624d. The light pipe assembly 630 has a length l' which is equal to ¼. This is because the four apertures 624a, 624b, 624c, 624d of the mask 620 result in a corresponding decrease in the length of the light pipe 630.

It should be noted that both the thickness and performance of the phase plate/LCD system are improved for displays with greater pixel densities, i.e., smaller pixels. Active matrix LCD technologies most suited to the phase plate technique are single-crystal silicon and polycrystalline silicon, either one in transmission or reflection mode. A further benefit of the phase plate technique is that the transmission of a transmissive active matrix LCD can be maintained even as the pixel size gets smaller. As the pixel size gets smaller, the optical aperture of the pixel is generally reduced. The phase plate technique concentrates the light onto the smaller optical aperture, allowing more light to be transmitted, offsetting the reduction in the optical aperture. Similarly, the phase plate technique is effective for reflective systems where only a fraction of the pixel area can be used to reflect the incident light.

As the pixel dimension decreases, the required distance between the phase plane and the image plane of the pixels also decreases. As such, small display panels with dense pixel arrays can provide color images with only a small cost in thickness to the display system. In preferred embodiments of the invention, the phase plate adds 1–2 mm to the thickness of the optics. Such systems are particularly useful where space is limited, such as in compact projection systems and head-mounted display systems.

Although the phase element has been previously illustrated as being separate from the LCD panel, that is not required to practice the invention. In another preferred embodiment the phase element can be fabricated within a housing for the LCD panel on the light incident side.

Figure 23:
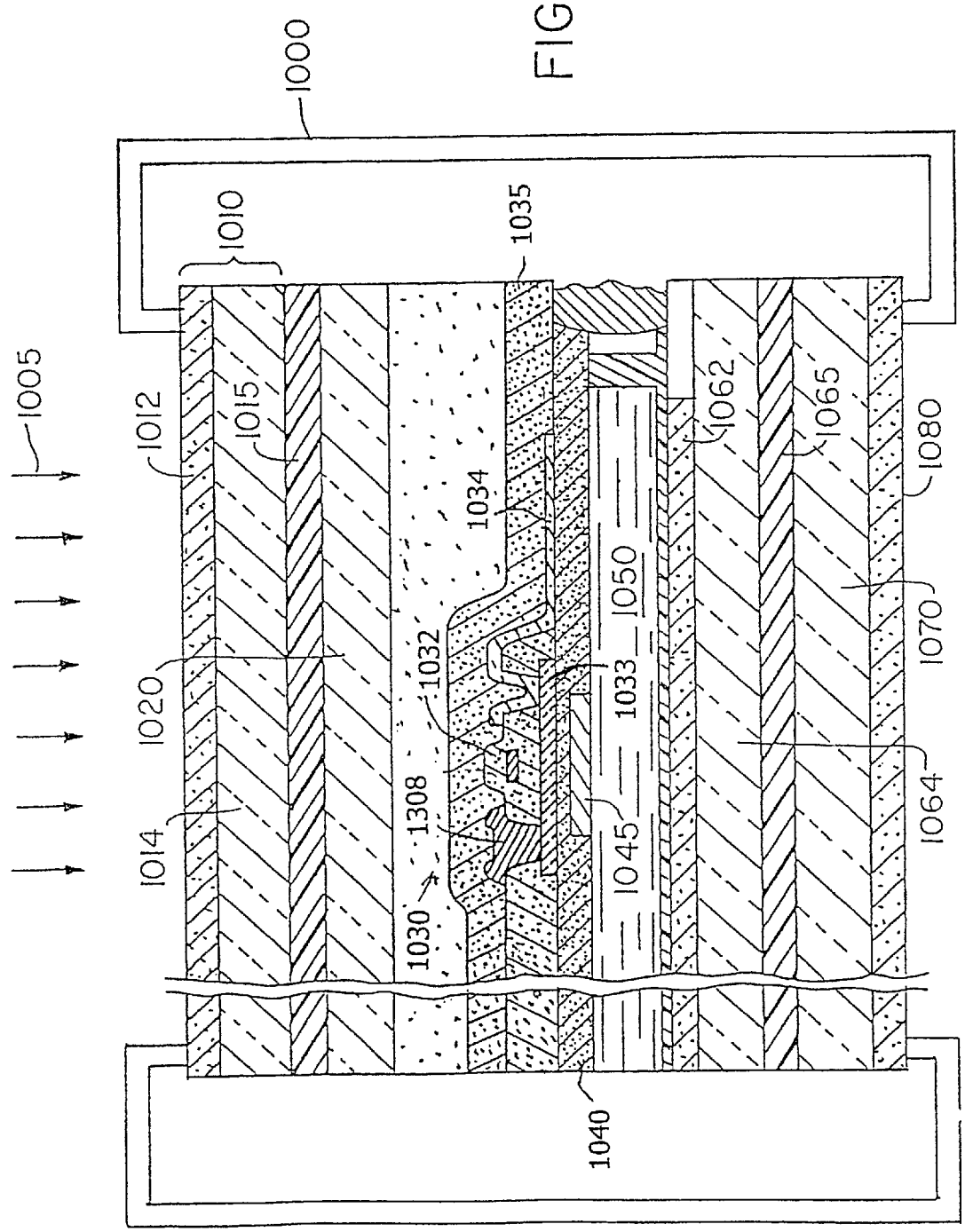
FIG. 23 is a partial cross-sectional view of an active matrix color display device in accordance with the invention.

FIG. 23 is a partial cross-sectional view of an active matrix color display device in accordance with the invention. Light 1005 from a light source is illustrated as impinging on the active matrix display device. Illustrated is one sub-pixel region of a pixel of the active matrix device. The display device is preferably fabricated using a lift-off and transfer process. A matrix housing 1000 provides structural support to the display device.

A phase plate 1010 includes a grating surface 1012 on a grating substrate 1014. The phase plate 1010 is bonded to a transfer substrate 1020 by a first adhesive layer 1015. A circuit substrate 1040 of insulating material such as $SiO_2$ is bonded to the transfer substrate 1020 by a second adhesive layer 1025. A sub-pixel element 1030 having a sub-pixel transistor 1032 and a sub-pixel electrode 1034 are formed in or on the circuit substrate 1040. The transistor is fabricated from a layer of single crystal silicon 1033 and the electrode 1034 is fabricated from a light transmissive material, such as single crystal silicon, polcrystalline or ITO. A passivation layer 1035 of SiN, for example, is formed over the sub-pixel element 1030. A detailed description of fabricating such sub-pixel elements 1030 is provided in U.S. Pat. No. 5,377,031, issued on Dec. 27, 1994 to Vu et al. and U.S. application Ser. No. 08/215,555, entitled "Method of Fabricating Active Matrix Pixel Electrodes," and filed on Mar. 21, 1994 by Zavracky et al., the teachings of which are incorporated herein by reference. Also illustrated is a contact metalization 1038 and a light shield (e.g., black matrix) element 1045.

A layer of liquid crystal material 1050 is disposed between the transistor 1030 and a counterelectrode 1062 on a glass substrate 1064. A polarizer 1070 is bonded to the counterelectrode substrate 1064 by an adhesive layer 1065. An anti-reflection coating 1080 is formed on the polarizer.

In preferred embodiments of the invention, the phase changes imparted by the phase plate do not necessarily have to be produced by an air-surface interface. The phase changes can occur in a boundary layer, where the index of refraction of the boundary layer is a function of position. Various techniques can be used to fabricate such a structure. For example, an optically sensitive layer such as dichromated gelatin can be deposited on a substrate and selectively exposed as a function of position. The expose step can be done using the masking technique, the direct writing technique or a holographic technique. After exposure, the index refraction of a particular location on the optically sensitive layer becomes a function of the optical exposure at that location.

Preferably, the display systems employing light pipes are integrated into a projector housing to create a projection display device. However, the length of the light pipe can be quite long where there is a single aperture. To make the projection display device more manageable, the light pipe must be either shortened as illustrated in FIG. 22 or folded, as described below.

Figure 24:
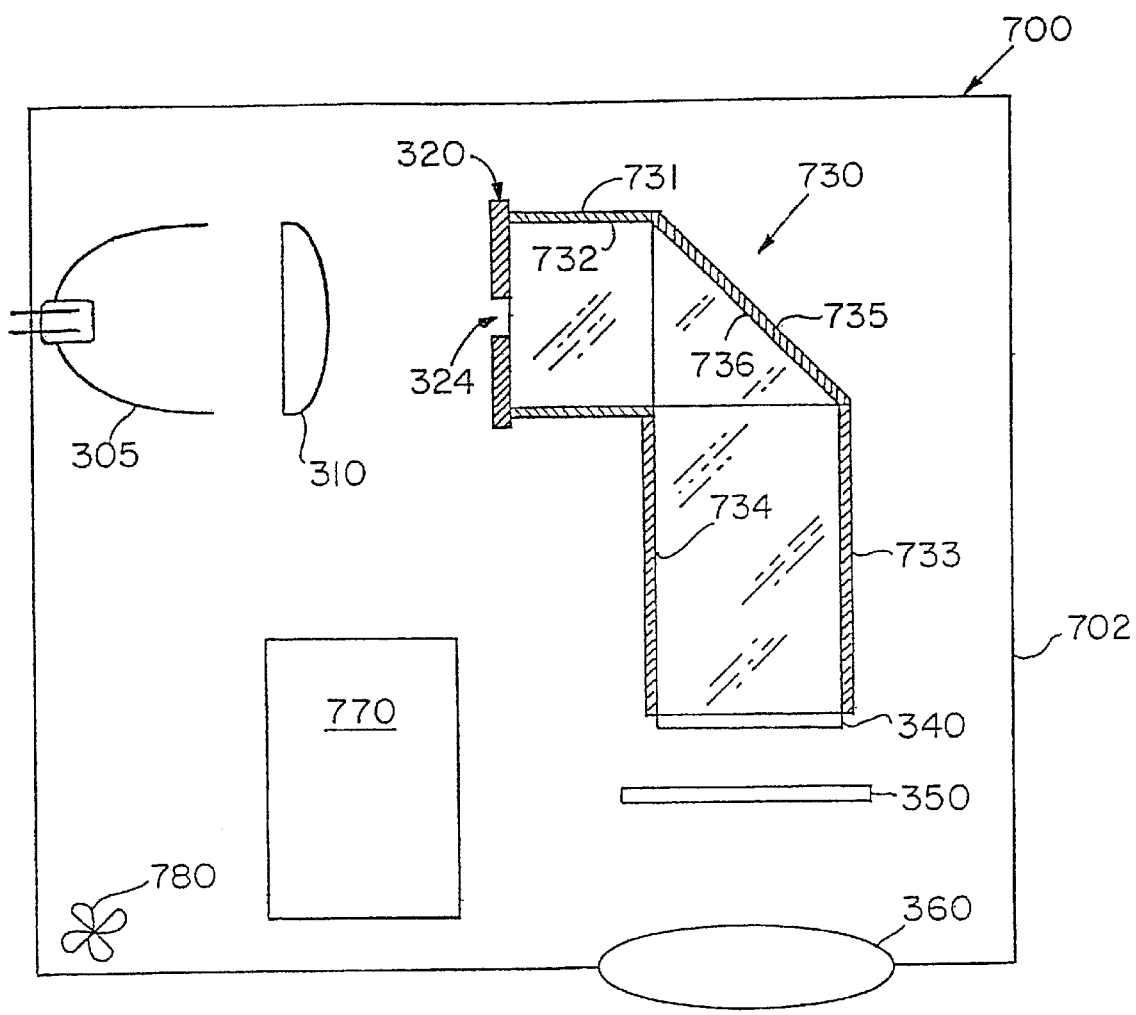
FIG. 24 is a schematic diagram of a preferred embodiment of the invention embodied in a display system having a folded light pipe illumination system.

FIG. 24 is a schematic diagram of a preferred embodiment of the invention embodied in a display system having a folded light pipe illumination system. The projection display system 700 includes a projector housing 702 in which the optical elements are enclosed. Light is provided by a light source 305, which is preferably a lamp with a parabolic reflector. The parallel light rays from the light source 305 are focused by a condenser lens 310 onto an aperture 324 of a mask 320. The light from the aperture 324 enters a folded light pipe 730, which mixes the light presented to a phase plate 340. The phase plate 340 disperses the incoming wavefront into red, green and blue wavelength components and directs those wavelength components onto sub-pixels of an LCD panel 350. A control circuit 770 drives the LCD panel 350 to create a display image which is projected by a projection lens 360 onto a viewing surface. A fan 780 is also disposed within the projector housing 702 to dissipate thermal energy from within the housing 702. As color filters are not being used, the thermal management demand on the cooling system can be reduced to provide for a more compact housing enclosure.

As illustrated, the light pipe 730 is folded to create a right-angle bend. The light pipe 730 comprises three optical subcomponents: a first light pipe subcomponent 731, a second light pipe subcomponent 733, and a prism subcomponent 735. The light pipe subcomponents 731, 733 include mirrored surfaces 732, 734. Likewise, the prism subcomponent 735 includes mirrored surfaces 736 on all sides. Although only a single prism 735 is illustrated to create one fold in the light pipe assembly 730, additional prisms can be employed to create multiple folds in the light pipe.

In the above embodiments, a light pipe has been described as mixing the light from the light source and matching the aspect ratios between the mask aperture and the phase plate. The light pipe, however, need not be used if the light source itself generates a well mixed light beam. One such light source has spherical reflector.

Figure 25:
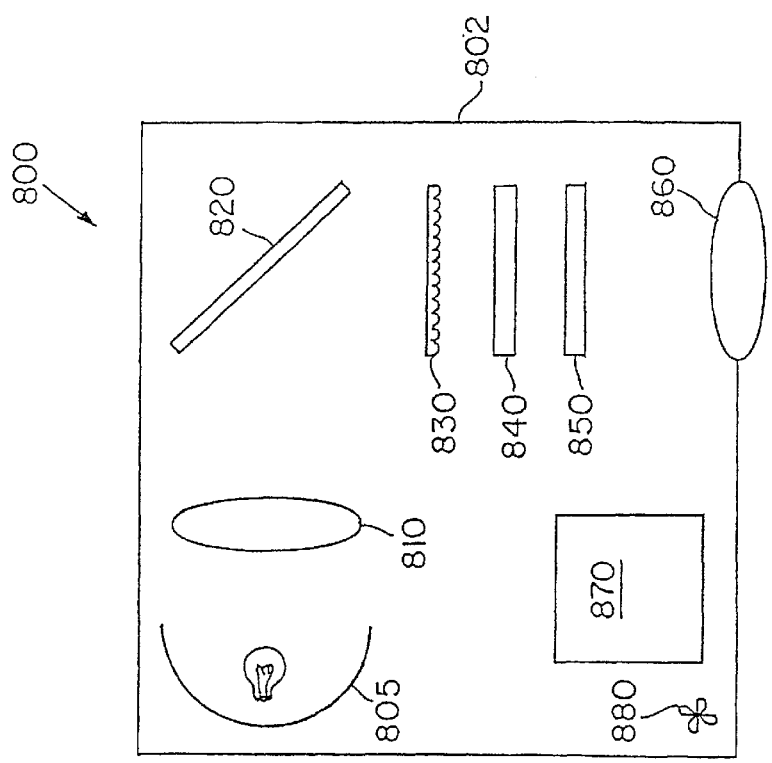
FIG. 25 is a schematic block diagram of a preferred embodiment of the invention embodied in a projection display system having a spherical reflector light source.

FIG. 25 is a schematic block diagram of a preferred embodiment of the invention embodied in a projection display system having a spherical reflector light source. The projection display system 800 includes a projector housing 802 in which the optical components are enclosed. A spherical light source 805 having a lamp and a spherical reflector is chosen to produce a well-mixed light beam.

The light beam from the spherical reflector is collected by a field lens 810 and directed toward a mirror 820. A mirror 820 is preferably oriented at 45° angle relative to the incoming light beam so as to create a 90° bend in the light path. Preferably, the mirror 820 is a cold mirror. The light beam then passes through a lenslet array 830, where the light is focused onto a phase plate 840 as described above. The light from the phase plate 840 is valved by an LCD panel 850 under the control of control circuitry 870 to create a color image. The color image is projected onto a viewing surface by a projection lens 860. A fan 880 is also disposed within the projector housing 802 to dissipate thermal energy from the projection display system 800.

Figure 26:
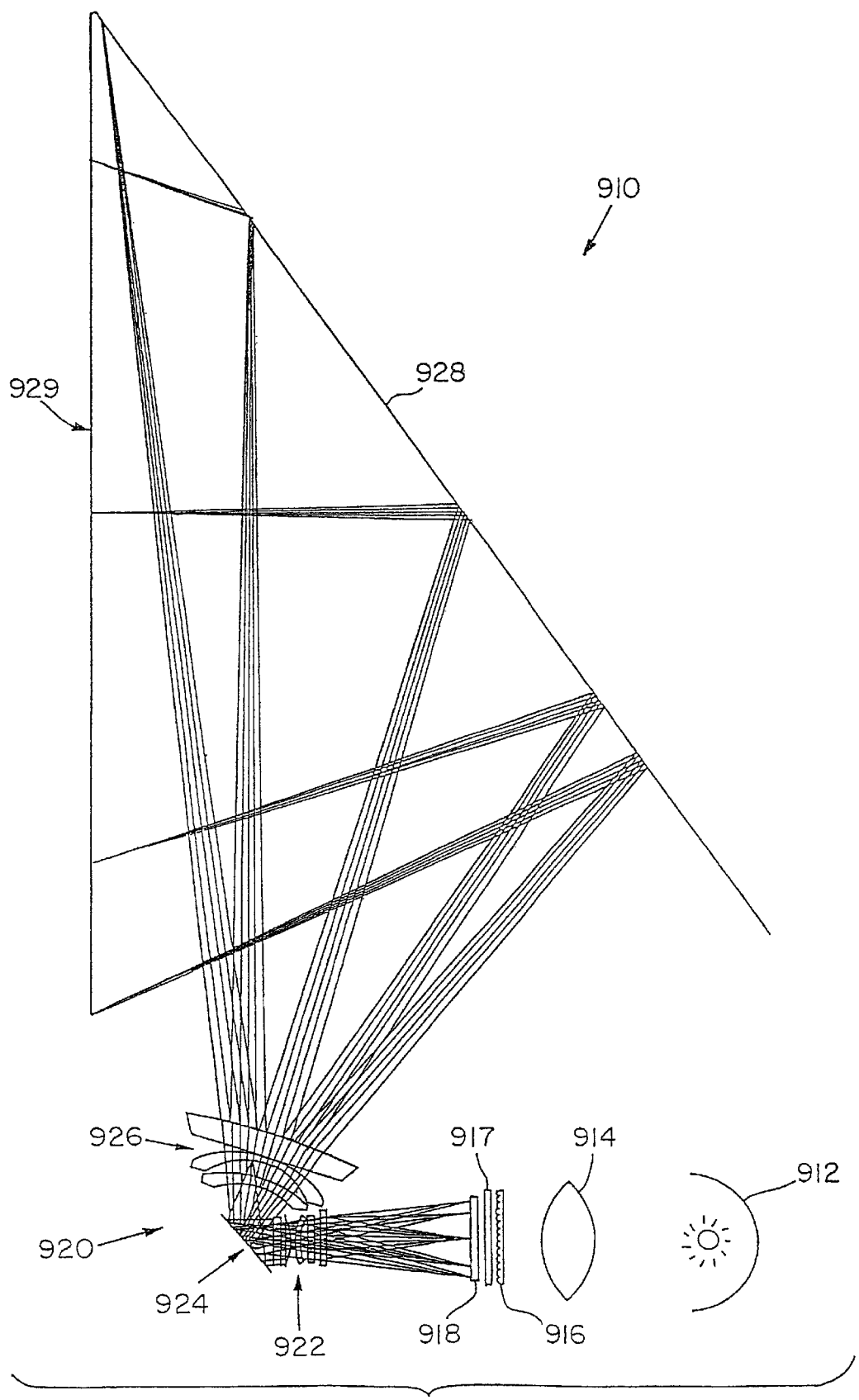
FIG. 26 is a schematic diagram of a preferred embodiment of the invention embodied in a projection monitor.

FIG. 26 is a schematic diagram of a preferred embodiment of the invention embodied in a projection monitor. The projection monitor 910 includes an illuminated LCD panel 918 and an optical arrangement 920 for directing the light beam from the LCD panel 918 to a screen 930. The projection system can include any of the aforementioned projection display system; particularly those using lamps as a light source. Further embodiments of projection monitors which can incorporate the invention are described in U.S. patent application Ser. No. 08/015,813, entitled "Projection Monitor" and filed on Feb. 10, 1993, the teachings of which are incorporated herein by reference.

As illustrated, a spherical light source 912 directs light to a lens 914 which converges the light onto a lenslet array 916. Light from the lenslet array 916 is focused onto a phase plate 917. A dispersed light from the phase plate is focused onto the display region of an LCD display panel 918. As described above, the phase plate 917 can disperse the light into monochrome light or color light.

The image light from the LCD panel 918 is directed through a collecting lens subsystem 922 onto a first mirror 924. The image light is then reflected off of first mirror 924 through a projection lens subsystem 926. Light is then re-reflected off of a second mirror 928, which forms the back of a monitor housing. The light from the second mirror 928 is then presented to a viewer on a viewing screen 929, which forms the front of the monitor housing.

Figure 27:
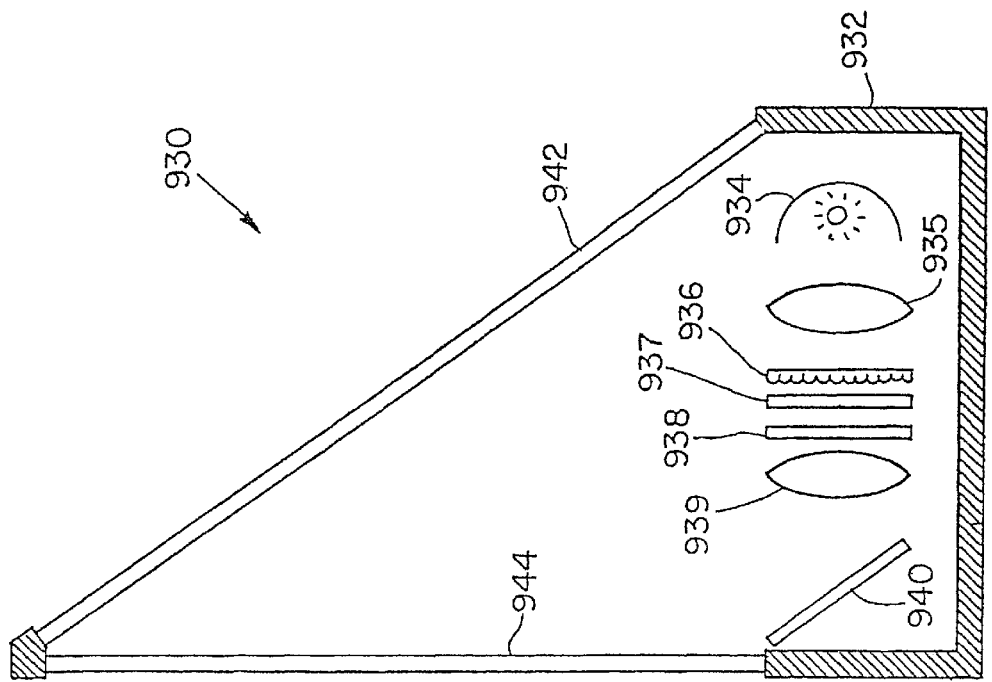
FIG. 27 is a schematic diagram of another preferred embodiment of the invention embodied in a projection monitor.

FIG. 27 is a schematic diagram of another preferred embodiment of the invention embodied in a projection monitor. The projection monitor 930 includes a monitor housing 932 securing a back mirror 942 and a viewing screen 944. Light from a spherical light source 934 is collected by a collecting lens 935 for delivery to a lenslet array 936. The lenslets 936 focus the light onto pixel regions of a phase plate 937. The dispersed light from the phase plate 937 impinges on individual sub-pixels of a display panel 938, which valves the light to create an image. The images are focused by a projection lens 939 onto a front projection mirror 940. The light is reflected off from the front projection mirror 940 onto the back mirror 942, which in turns reflects the light onto the viewing screen 944.

The above projection display devices can include a user interface. For example, the display devices can include either housing-mounted or remotely-mounted control buttons, such as for adjusting brightness, contrast, color, and focus. The display device can also include a motor actuated zoom lens, which can be remotely controlled by the user. The display device can also include speakers with user-controllable balance, tone and volume. A storage device such as a disk drive or CD-ROM player and a computer interface can be provided to complete a multimedia system.

Figure 28:
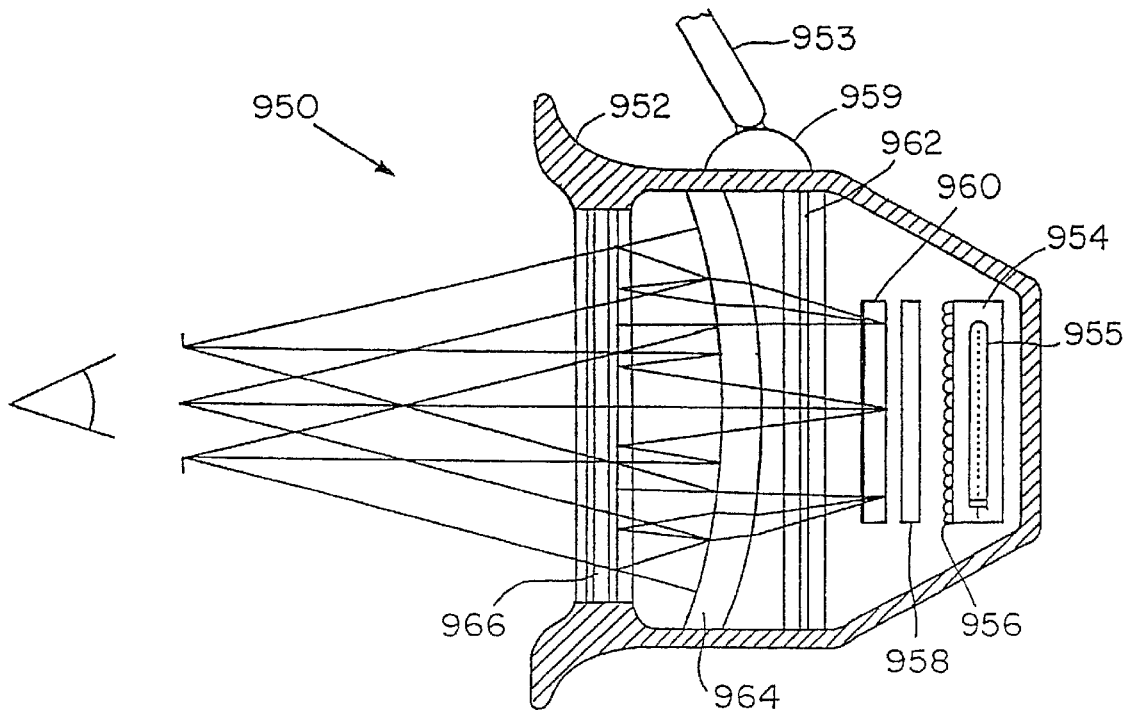
FIG. 28 is a schematic diagram, shown partially in cross-section, of a preferred embodiment of the invention embodied in a direct-view head-mounted display device 950.

FIG. 28 is a schematic diagram, shown partially in cross-section, of a preferred embodiment of the invention embodied in a direct-view head-mounted display device 950. Shown is a display housing 952 in close proximity to an eye of a user. The display housing 952 is preferably fabricated from plastic, but other lightweight materials can also be used. As illustrated, the display housing 952 is coupled to a mounting arm 953 by a swivel joint 959. The mounting arm connects to head-mounted frame to-form a monocular display device.

A backlight 955, such as the lamp elements 215 of FIG. 17, is mounted in a lamp housing 954 which includes reflective inner surfaces. Light from the backlight 955 is projected through a lenslet array 956, a phase plate 958 and a display panel 960 to form an image.

The display system also includes a polarizing filter 962, a semi-reflective concave mirror 964, and a cholesteric liquid crystal (CLC) element 966. The image that is generated by the display panel 960 is transmitted through the filter 962, the semi-reflective concave mirror 964 to the CLC element 966. The CLC element 966 reflects the image back onto the mirror 964 which rotates the light so that, upon reflection back to the CLC element 966, the light is transmitted through the CLC element 966 to the viewer's eye. A lens can be used with this system depending upon the size, resolution, and distance to the viewer's eye of the optical system components and the particular application. A focus adjust mechanism can also be provided for use by the user.

Figure 29:
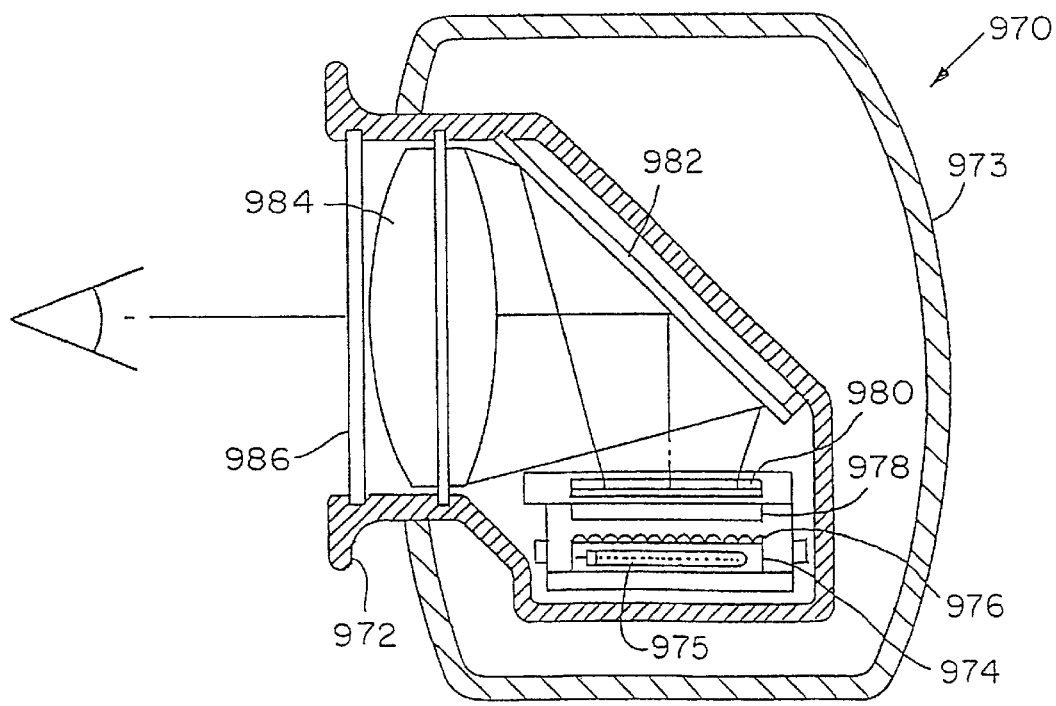
FIG. 29 is a schematic diagram, shown partially in cross-section, of a preferred embodiment of the invention embodied in a projection head-mounted display device 970.

FIG. 29 is a schematic diagram, shown partially in cross-section, of a preferred embodiment of the invention embodied in a projection head-mounted display device 970. Shown is a plastic display housing 972 in close proximity to the eye of the user. As illustrated, the display housing 972 is coupled to a head-mounted frame 973 to form one-half of a binocular display device.

A backlight 975, such as the lamp 215 of FIG. 17 is mounted in a lamp housing 974 which includes reflective inner surfaces. Light from the backlight 975 is projected through a lenslet array 976, a phase plate 978 and display panel 980 to form an image. The image is reflected off from a mirror 982, through a viewing lens 984 and a cover glass 986 to be viewed by the user.

Further embodiments of head-mounted display devices which can incorporate the invention are described in U.S. patent application Ser. No. 08/327,113, entitled "Head-Mounted Display System" and filed on Oct. 21, 1994, the teachings of which are incorporated herein by reference.

Figure 30:
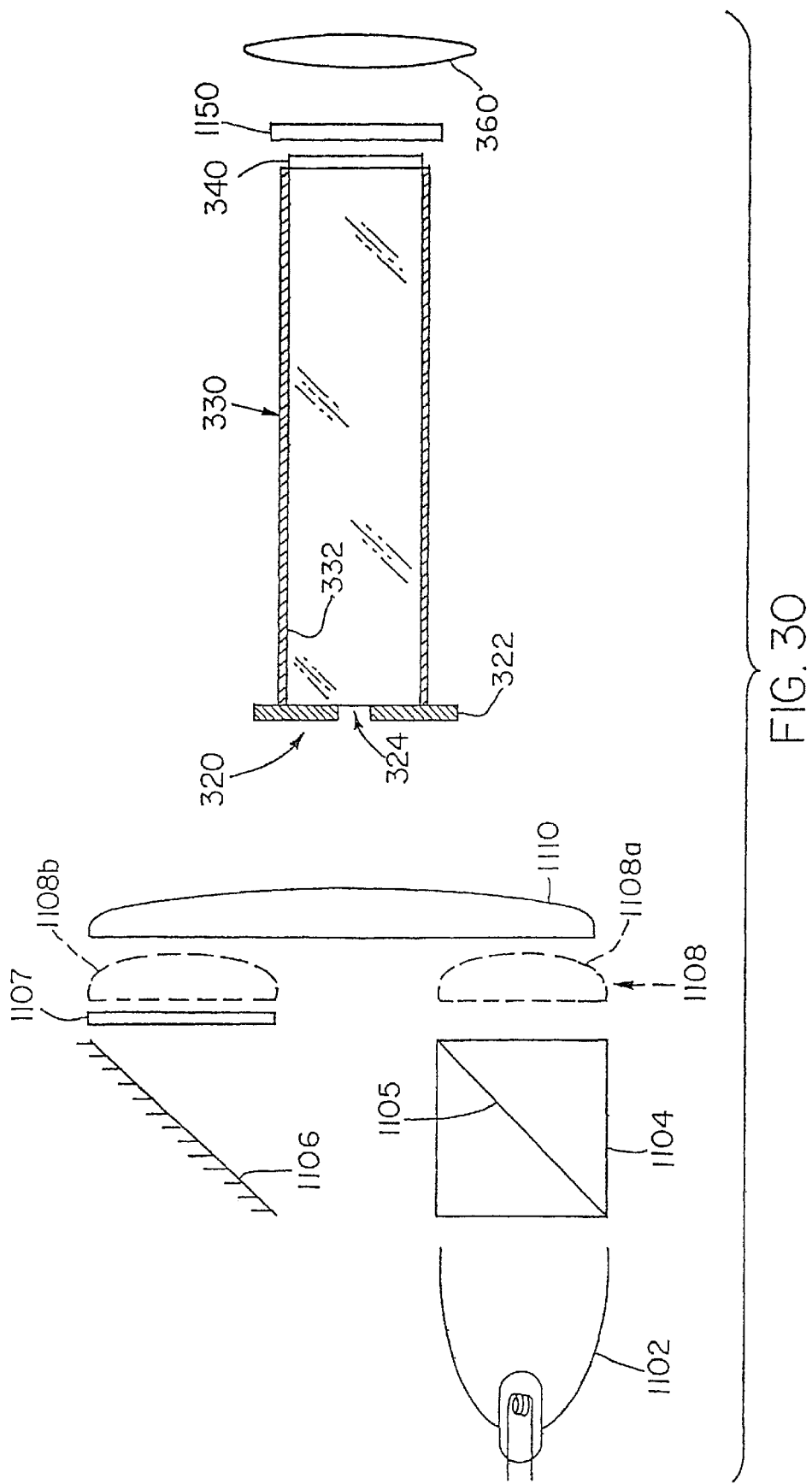
FIG. 30 is a schematic diagram, shown partially in cross-section, of a preferred embodiment of the invention embodied in a projection display system having a virtual light source.

FIG. 30 is a schematic diagram, shown partially in cross-section, of a preferred embodiment of the invention embodied in a projection display system having a virtual light source. Like previous embodiments of the invention, a light pipe 330 is used to mix light prior to the light passing through a phase plate 340. The phase plate is registered to a light valve display panel 1150 which is electronically controlled to form an image for projection through a projection lens 360. Unlike previously described embodiments of the invention, the light valve display panel 1150 does not include a front polarizer, only a back polarizer. The incident light is polarized, instead, at the light source.

Light from a lamp 1102 is split by a broadband polarizing beamsplitter 1104 into polarized light, which passes through the beamsplitter 1104 and unpolarized light which is reflected at the interface 1105. The polarized light is focused by a main focusing lens 1110 and an optional secondary focusing lens 1108a onto the aperture 324 of the light pipe 330.

The unpolarized light is recovered by a recovery optic to create a virtual light source. The unpolarized light reflected from the interface 1105 is reflected by a recovery mirror 1106 so that the light passes through a one-quarter wave plate 1107. The wave plate 1107 polarizes the waste light from the beamsplitter 1104, which is in turn directed to the aperture 324 of the light pipe 330 by the main focusing lens 1110 and an optional secondary focusing lens 1108b.

An unpolarized beam of light from the lamp 1102 is thus split into two beams of different and orthogonal polarizations. The reflected waste beam is redirected with the recovery mirror 1106 and converted via the quarter-wave plate 1107 to the polarization of the transmitted beam. The special separation or angular separation between the two beams is chosen so the two beams are collected and transmitted through the phase plate 340, where they add to one another constructively. Although only one lamp 1102 is illustrated, multiple lamps, each with a polarizing beamsplitter, can be used to form a two-dimensional array of light sources.

Although the above preferred embodiments of the invention have been described as using transmissive liquid crystal display panels, other display panels can be used. For example, the invention can be used with a digital micromirror device (DMD), which have an array of reflective electromechanical pixels (i.e., micromirrors). Light incident on each pixel is reflected in either of two directions based on whether the pixel is on or off. Such systems are described in further detail in U.S. Pat. Nos. 5,382,961 and 5,457,493, the teachings of which are incorporated herein by reference.

Figure 31:
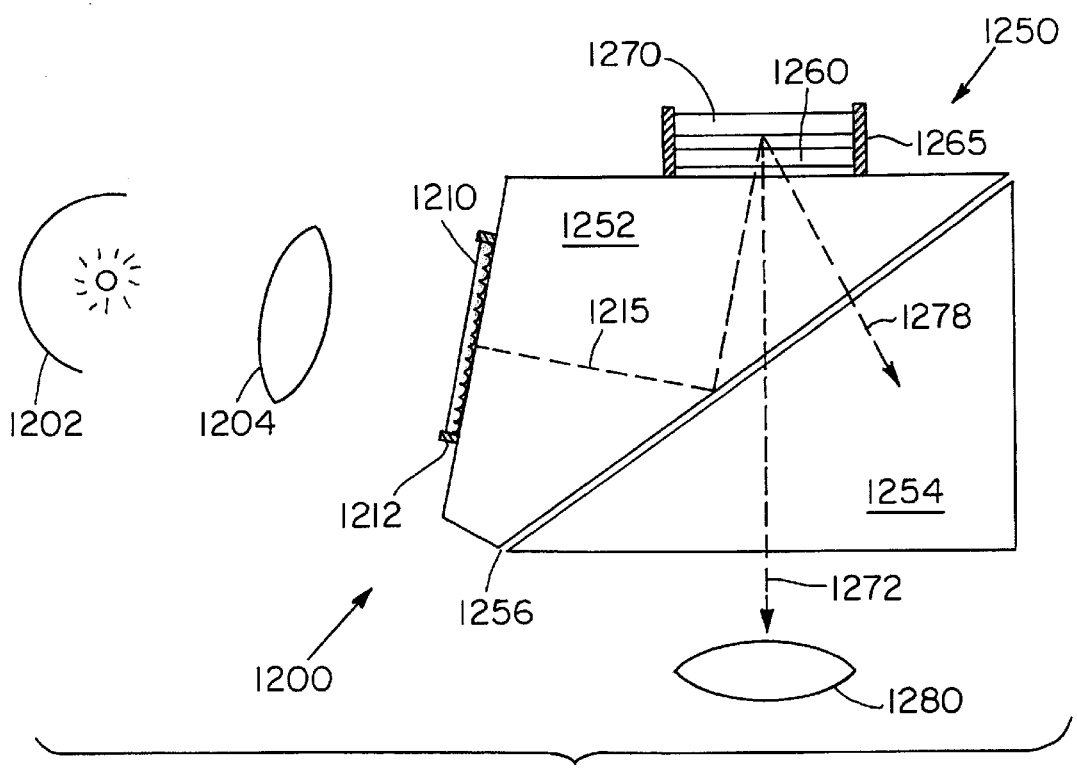
FIG. 31 is a schematic diagram of a preferred embodiment of the invention embodied in a display system having a digital micromirror device (DMD).

FIG. 31 is a schematic diagram of a preferred embodiment of the invention embodied in a display system having a digital micromirror device (DMD). Light is created by a spherical reflector lamp 1202. A collimating lens 1204 collects the mixed light from the spherical reflector lamp 1202 and forms parallel rays of white light. A lenslet array 1210 is attached to a face of a total internal reflection (TIR) prism 1250 by a mounting member 1212. A phase plate 1260 and a DMD 1270 are attached to another face of the TIR prism 1250 by a mounting member 1265. The microlens array 1210 and the phase plate 1260 are registered before being mounted to the TIR prism 1250. The registration is accomplished by optically aligning the elements through the TIR prism 1250. A preferred apparatus and method for mounting the microlens array 1210 and phase plate 1260 is described in U.S. patent application Ser. No. 08/285,955, filed Aug. 4, 1994 by Bryan E. Loucks, the teachings of which are incorporated herein by reference. Other suitable mounting members can also be used. In turn, the sub-pixels on the DMD 1270 are registered to the phase plate 1260. The phase plate 1260 and the DMD 1270 can also be fabricated as a single element where the registration is performed during the fabrication process.

Briefly, the TIR prism 1250 is configured to totally reflect an illumination beam from the light source at the air gap 1255. The reflected beams from the DMD 1270 are transmitted through the air gap 1255. The thickness of the air gap 1255 is minimized to reduce aberrations in the transmitted beam. Such TIR prisms are discussed in detail in U.S. Pat. No. 4,983,032, the teachings of which are incorporated herein by reference.

Shown are the optical paths for a single light bundle representing a sub-pixel of the display. An incoming light bundle of white light 1215 from a lenslet of the lenslet array 1210 is reflected off of the interface 1255 between the prism elements 1252, 1254. The light bundle of white light 1215 is dispersed by the phase plate 1260 onto red, green and blue sub-pixels of the DMD 1270. If a particular sub-pixel is on, a transmitted color light bundle 1272 reflected from the sub-pixel micromirror passes through the TIR prism 1250 to a projection lens 1280. If the sub-pixel is off, the resulting color light bundle 1278 reflected from the sub-pixel micromirror is directed into the TIR prism 1250 and does not exit through the projection lens 1280.

It should be noted that light passes through the phase plate 1260 two times. The spacing between the phase plate 1260 and the DMD 1270 must be small enough so the phase plate 1260 does not destroy the pixel resolution of image formed by the DMD 1270. In preferred embodiments of the invention, the pixel pitch is between 30–60 µm with a sub-pixel pitch of between 10–20 µm. As such, the spacing between the phase plate 1260 and the DMD 1270 is between about 600 µm–2 mm. For the case of the transmitted light bundle 1272, the second pass of the light through the phase plate 1260 thus depixelizes the resulting image by spreading the reflected light from the pixel mirror over the area of the sub-pixel.

Although a spherical reflector is illustrated in FIG. 30, other techniques to provide light to the TIR prism 1250 can be employed by devices embodying the invention. In particular, a light pipe such as described above can be used.

Figure 32:
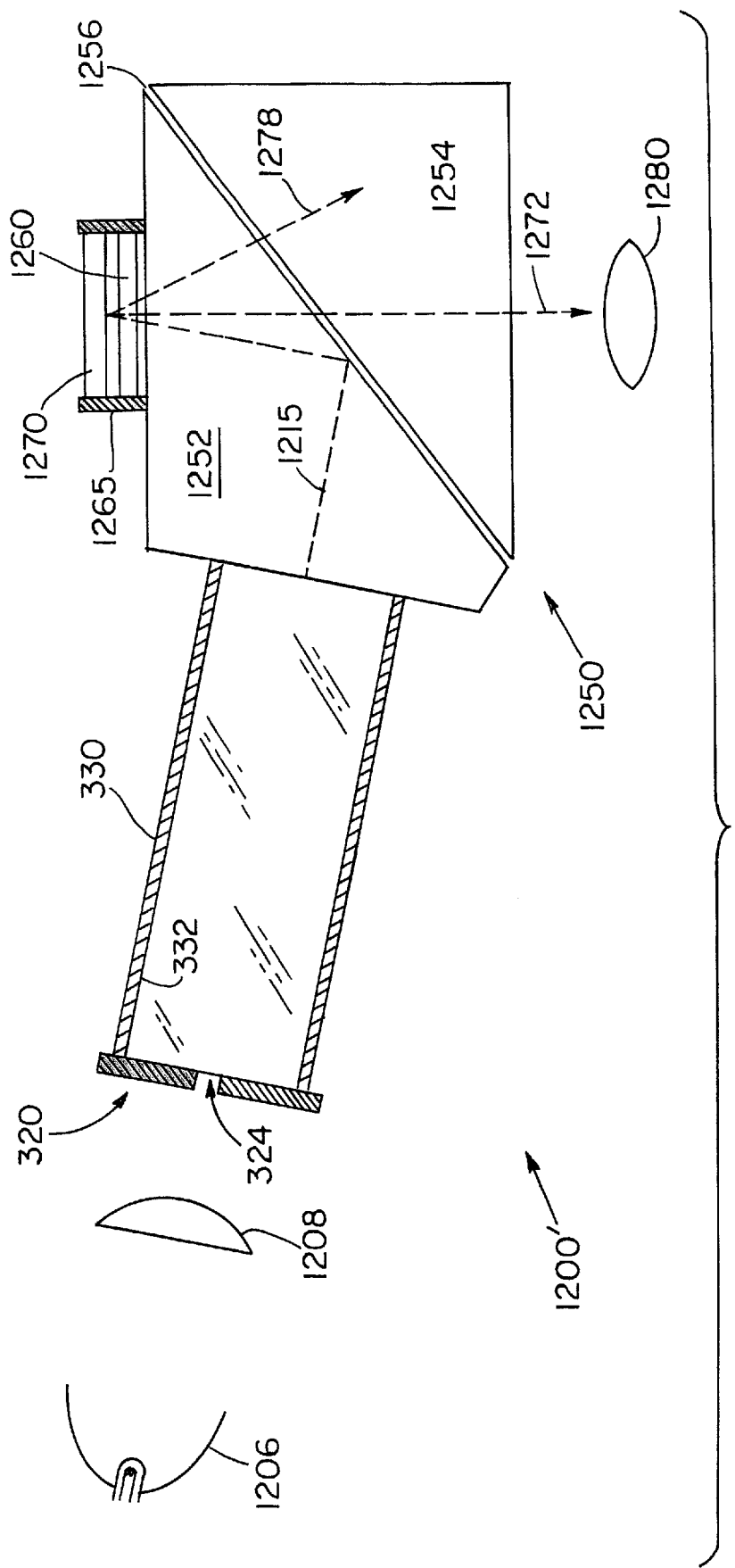
FIG. 32 is a schematic diagram, partially in cross-section, of a preferred embodiment of the invention embodied in a DMD projection system having a light pipe.

FIG. 32 is a schematic diagram, partially in cross-section, of a preferred embodiment of the invention embodied in a DMD projection system having a light pipe. Light is provided to the TIR prism 1250 through a light pipe 330 as described above. A lamp 1206 generates a beam of light which is focused by a focusing lens 1208 through the aperture 324 of the light pipe 330. After entering the TIR prism, the light behaves as discussed above with reference to FIG. 30.

Figure 33:
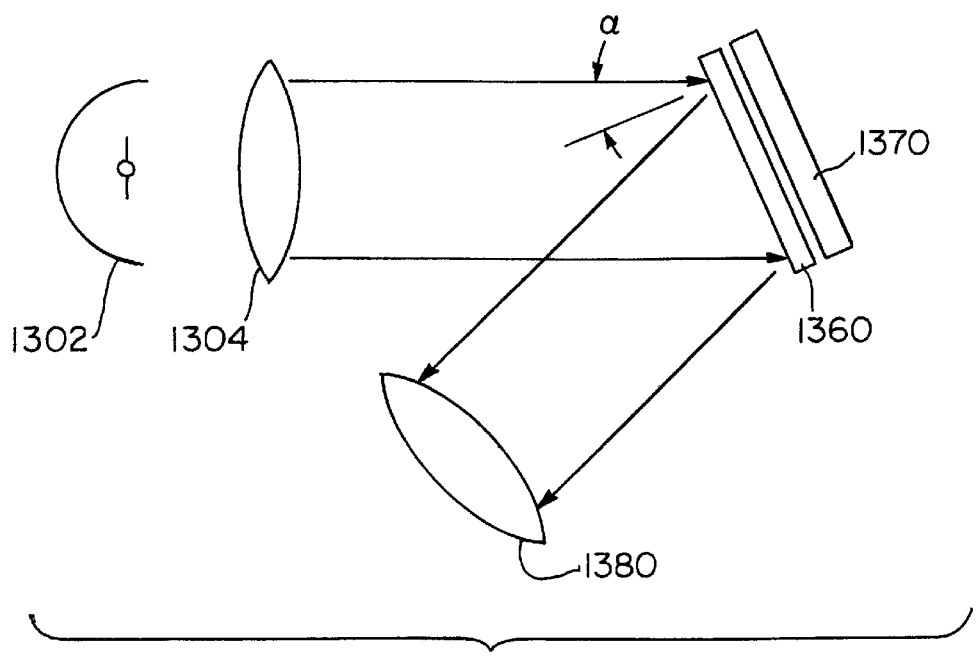
FIG. 33 is a schematic diagram, partially in cross section, of a preferred embodiment of the invention embodied in a reflective liquid crystal display system.

FIG. 33 is a schematic diagram, partially in cross section, of a preferred embodiment of the invention embodied in a reflective liquid crystal display system. Illustrated is a lamp 1302 having a spherical reflector to generate well-mixed white light. The light from the lamp 1302 is collimated by a lens 1304. The parallel rays of light are wavelength dispersed by a diffractive optic element 1360, fabricated as described above. Each of the red, green and blue wavelength regions are targeted onto specific sub-pixel regions of a reflective liquid crystal display panel 1370.

If a sub-pixel is activated, the respective wavelength region passes through a respective volume liquid crystal material and impinges on a reflective electrode. The wavelength region of light is then reflected by the electrode back through the same volume of liquid crystal material toward a projection or viewing lens 1380. As illustrated, the light is incident on the diffractive optic element 1360 and the display panel 1330 at an angle a relative to the normal axis.

Because reflective electrodes are used, the controlling transistors for each sub-pixel electrode can be fabricated beneath the electrode. Such an arrangement allows for a smaller pixel pitch and full usage of the surface of the display panel 1370 without requiring mechanical elements. The display device can therefore be more compact than transmission liquid crystal displays.

Although certain combinations of housings and optical configurations have been illustrated and described, the scope of the invention is not limited to those particular combinations. The housings and optical configurations can be interchanged and different housings can be employed with any optical configuration, including those optical configurations which are shown without a housing.

Equivalents

Those skilled in the art will know, or be able to ascertain using no more than routine experimentation, many equivalents to the specific embodiments of the invention described herein. These and all other equivalents are intended to be encompassed by the following claims.

This invention claimed is:

1. A transmissive active matrix liquid crystal display device comprising:

an active matrix array of transistor circuits and pixel electrodes over an insulating layer, each pixel electrode being electrically connected to a transistor circuit that actuates the pixel electrode;

an optically transmissive substrate bonded to the active matrix array with an adhesive layer on a first side of the insulating layer;

a layer of liquid crystal material positioned between a second side of the insulating layer and a counterelectrode to form a transmissive display structure such that actuation of the pixel electrodes controls transmission of light through a volume of the liquid crystal material;

a diffractive optical element aligned with the active matrix array to disperse light of different colors through different volumes of the liquid crystal material; and a housing that contains the transmissive display structure and the diffractive optical element.

2. The display device of claim 1 wherein the diffractive optical element is bonded to the active matrix array.

3. The display device of claim 1 wherein the diffractive optical element includes a light polarizer.

4. The display device of claim 1 wherein the housing forms a direct-view display device.

5. The display device of claim 1 wherein the housing forms a projected-view display device.

6. The display device of claim 1 further comprising an illumination system for providing light to the diffractive optical element.

7. The display device of claim 6 wherein the illumination system includes a light pipe.

8. The display device of claim 7 wherein the light pipe is a folded light pipe.

9. The display device of claim 6 wherein the illumination system includes a reflective box light source.

10. The display device of claim 6 wherein the illumination system includes a lenslet array, the lenslet array being optically aligned with the diffractive optical element.

11. The display device of claim 1 further comprising a viewing optic.

12. The display device of claim 11 wherein the viewing optic includes a cholesteric liquid crystal (CLC) element.

13. A reflective display device comprising:
    an array of light reflective pixels;
    a diffractive optical element aligned with the array of pixels to disperse light of different colors onto different pixels;
    an optical system that couples light from the diffractive optical element onto the reflective pixels; and
    a housing that contains the array of light reflective pixels and the diffractive optical element.

14. The display device of claim 13 when the pixels are electromechanically actuated.

15. The display device of claim 13 further comprising a layer of electrically actuated light valve material disposed between the array of pixels and the diffractive optical element.

16. The display device of claim 13 further comprising a total internal reflection (TIR) mirror to guide source light from a light source to the array of pixels and reflected light from pixels toward a viewer.

17. A method of fabricating a transmissive active matrix liquid crystal display device comprising the steps of:
    providing an active matrix array of transistor circuits and pixel electrodes on an insulating layer, each pixel electrode being electrically connected to a transistor circuit that actuates the pixel electrode;
    bonding an optically transmissive substrate to the active matrix array with an adhesive layer;
    forming a transmissive display structure by positioning a layer of liquid crystal material between the insulating layer and a counterelectrode such that actuation of the pixel electrodes controls transmission of light through a respective volume of the liquid crystal material;
    aligning a diffractive optical element with the active matrix array to disperse light of different colors through different volumes of the liquid crystal material; and
    enclosing the transmissive display structure and the diffractive optical element within a housing.

18. The method of claim 17 further comprising the step of bonding the diffractive optical element to the active matrix array.

19. The method of claim 17 wherein the diffractive optical element includes a light polarizer.

20. The method of claim 17 wherein the step of enclosing forms a direct-view display device.

21. The method of claim 17 wherein the step of enclosing forms a projected-view display device.

22. The method of claim 17 further comprising the step of providing light to the diffractive optical element from an illumination system.

23. The method of claim 22 wherein the illumination system includes a light pipe.

24. The display device of claim 23 wherein the light pipe is a folded light pipe.

25. The display device of claim 22 wherein the illumination system includes a reflective box light source.

26. The display device of claim 22 wherein the illumination system includes a lenslet array and the step of providing light includes optically aligning the lenslet array with the diffractive optical element.

27. The display device of claim 17 further comprising the step of optically aligning a viewing optic with the acting matrix array.

28. The display device of claim 27 wherein the viewing optic includes a cholesteric liquid crystal (CLC) element.

* * * * *